US009935022B2

(12) United States Patent
Owen

(10) Patent No.: US 9,935,022 B2
(45) Date of Patent: Apr. 3, 2018

(54) SYSTEMS AND METHODS OF CHARACTERIZING PROCESS-INDUCED WAFER SHAPE FOR PROCESS CONTROL USING CGS INTERFEROMETRY

(71) Applicant: Ultratech, Inc., San Jose, CA (US)

(72) Inventor: David M. Owen, Redondo Beach, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/362,923

(22) Filed: Nov. 29, 2016

(65) Prior Publication Data

US 2017/0162456 A1     Jun. 8, 2017

Related U.S. Application Data

(60) Provisional application No. 62/263,917, filed on Dec. 7, 2015.

(51) Int. Cl.
*H01L 21/00*     (2006.01)
*H01L 21/66*     (2006.01)
(Continued)

(52) U.S. Cl.
CPC .......... *H01L 22/20* (2013.01); *G01B 9/02098* (2013.01); *G01B 11/161* (2013.01);
(Continued)

(58) Field of Classification Search
CPC ......... H01L 22/00; H01L 22/10; H01L 22/12; H01L 22/20; H01L 22/22; H01L 22/30
See application file for complete search history.

(56) References Cited

U.S. PATENT DOCUMENTS 3,829,219 A     8/1974    Wyant
5,227,641 A     7/1993    Cheng
(Continued)

FOREIGN PATENT DOCUMENTS

DE    102007007697 A1    7/2008
EP    0794465 A2    9/1997
(Continued)

OTHER PUBLICATIONS

Rimmer et al., "Evaluation of large aberrations using a lateral-shear interferometer having variable shear," Appl. Opt., vol. 14, pp. 142-150, Jan. 1975.
(Continued)

*Primary Examiner* — Thanh Y Tran
(74) *Attorney, Agent, or Firm* — Downs Rachlin Martin PLLC

(57) ABSTRACT

Systems and methods of characterizing wafer shape using coherent gradient sensing (CGS) interferometry are disclosed. The method includes measuring at least $3 \times 10^6$ data points on a wafer surface using a CGS system to obtain a topography map of the wafer surface. The data are collected on a wafer for pre-processing and post-processing of the wafer, and the difference calculated to obtain a measurement of the effect of the process on wafer surface shape. The process steps for processing the same wafer or subsequent wafers are controlled based on measured process-induced change in the wafer surface shape in order to improve the quality of the wafer processing.

23 Claims, 20 Drawing Sheets

(51) Int. Cl.
*H01L 23/544* (2006.01)
*G01B 9/02* (2006.01)
*G01B 11/16* (2006.01)
*G01B 11/24* (2006.01)

(52) U.S. Cl.
CPC ......... *G01B 11/2441* (2013.01); *H01L 22/12* (2013.01); *H01L 23/544* (2013.01); *G01B 2210/56* (2013.01); *H01L 2223/54426* (2013.01)

(56) References Cited

U.S. PATENT DOCUMENTS

| | | | |
|---|---|---|---|
| 5,252,414 | A | 10/1993 | Yamashita et al. |
| 5,526,116 | A | 7/1996 | DeGroot |
| 5,572,323 | A | 11/1996 | Maeda et al. |
| 5,814,729 | A | 9/1998 | Wu et al. |
| 5,863,680 | A | 1/1999 | Kawakubo et al. |
| 6,031,611 | A | 2/2000 | Rosakis et al. |
| 6,469,788 | B2 | 10/2002 | Boyd et al. |
| 6,600,565 | B1 | 7/2003 | Suresh et al. |
| 6,924,497 | B2 | 8/2005 | Suresh et al. |
| 7,369,251 | B2 | 5/2008 | Rosakis et al. |
| 7,383,156 | B2 | 6/2008 | Matsushita et al. |
| 7,410,735 | B2 | 8/2008 | Reuhman-Huisken et al. |
| 9,177,370 | B2 | 11/2015 | Chen et al. |
| 2002/0080364 | A1 | 6/2002 | Monshouwer et al. |
| 2002/0088952 | A1 | 7/2002 | Rao et al. |
| 2002/0102482 | A1 | 8/2002 | Smith et al. |
| 2004/0195657 | A1* | 10/2004 | Miyashita ............. B24B 37/042 257/618 |
| 2007/0212856 | A1 | 9/2007 | Owen |
| 2008/0182344 | A1 | 7/2008 | Mueller et al. |
| 2013/0089935 | A1* | 4/2013 | Vukkadala ......... G01B 9/02021 438/5 |
| 2015/0120216 | A1* | 4/2015 | Vukkadala ............. G01N 19/08 702/35 |

FOREIGN PATENT DOCUMENTS

| | | |
|---|---|---|
| EP | 1477851 A1 | 11/2004 |
| JP | S63184029 A | 7/1988 |
| JP | 2003086501 A | 3/2003 |
| SG | 191486 A1 | 7/2013 |
| WO | 2001082335 A2 | 11/2001 |
| WO | 2002099373 A2 | 12/2002 |

OTHER PUBLICATIONS

Schreiber et al., "Lateral shearing interferometer based on two Ronchi phase gratings in series," Appl. Opt., vol. 36, No. 22, Aug. 1, 1997, p. 5321-24.

* cited by examiner

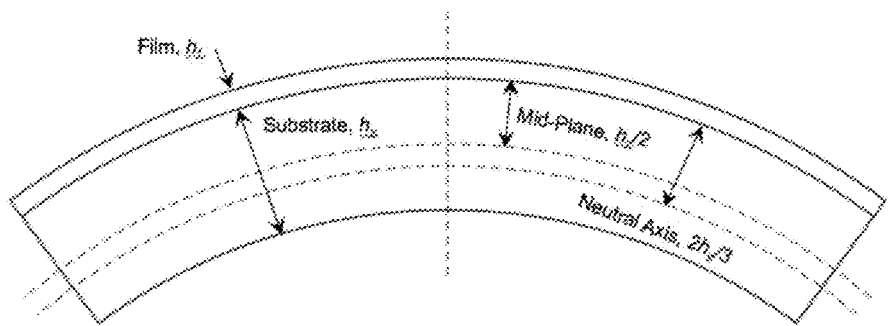

- Thin film stress, $\sigma_f$:  $\sigma_f = \dfrac{M_s h_s^2}{6 h_f} \Delta \kappa$
- Displacement due to stress:  $u = -\dfrac{2}{3} h_s \dfrac{\partial w}{\partial x}$
- Displacement due to bending: $u = -\dfrac{1}{2} h_s \dfrac{\partial w}{\partial x}$ Displacement residual due to non-uniform stress $u = -\dfrac{1}{6} h_s \dfrac{\partial w}{\partial x}$ w = topography; σ = stress; M = biaxial modulus; h = thickness; κ = curvature; subscript f = film; subscript s = substrate

*Prior art*

FIG. 1B

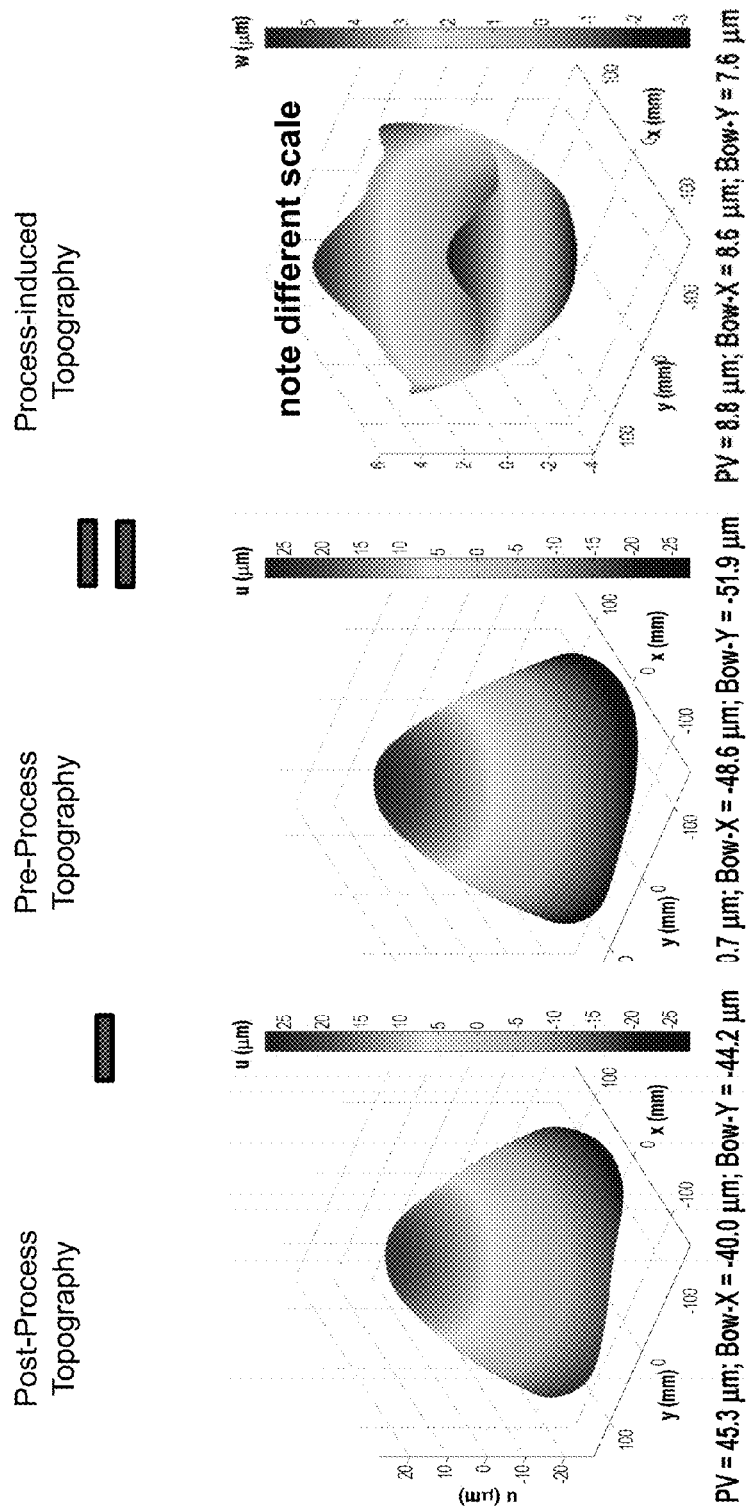

Film Deposition

Anneal

Etch

Strip

Measured Topography
Residual Topography
(Best-Fit Subtracted)
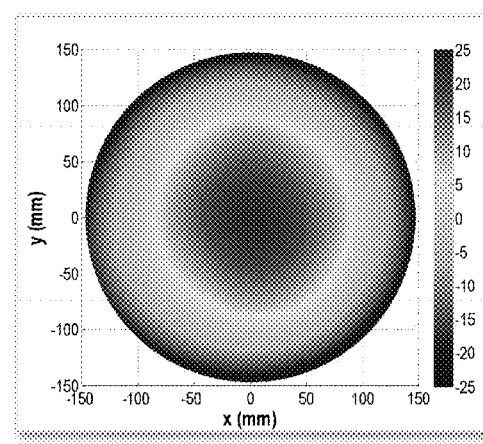
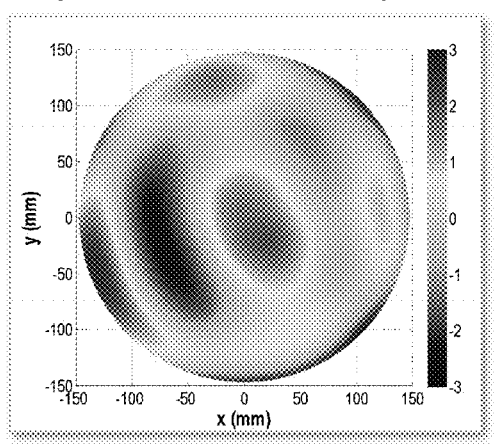
FIG. 7A
FIG. 7B Establish Sampling Plan: Path P3

Establish Sampling Plan: Path P4

Implications of process for Front/Back-Side stress unknown for one or more processes and that uncertainty is significant

SYSTEMS AND METHODS OF CHARACTERIZING PROCESS-INDUCED WAFER SHAPE FOR PROCESS CONTROL USING CGS INTERFEROMETRY

CROSS-REFERENCE TO RELATED APPLICATIONS

This application claims priority under 35 USC 119(e) from U.S. Provisional Patent Application Ser. No. 62/263,917, filed on Dec. 7, 2015, and which is incorporated by reference herein.

FIELD

The present disclosure relates generally to semiconductor fabrication and to characterizing the wafers used in semiconductor fabrication, and more particularly relates to systems and methods of characterizing process-induced wafer shape using coherent gradient sensing (CGS) interferometry, and using the characterized wafer shape for controlling and improving the semiconductor fabrication process.

The entire disclosure of any publication or patent document mentioned herein is incorporated by reference, including U.S. Pat. Nos. 3,829,219 and 5,526,116 and 6,031,611, and the publications by M. P. Rimmer et al., "Evaluation of large aberrations using lateral-shear interferometer having a variable shear," App. Opt., Vol. 14, No. 1, pp. 142-150, January 1975, and by Schreiber et al., "Lateral shearing interferometer based on two Ronchi phase gratings in series," App. Opt., Vol. 36, No. 22, pp. 5321-5324, August 1997, and by Brunner et al., "Characterization of wafer geometry and overlay error on silicon wafers with nonuniform stress," J. Micro/Nanolith., MEMS MOEMS 12(4), 043002-1 through 12, (October-December 2013).

BACKGROUND ART

The fabrication of semiconductor wafers involves performing a number (tens or many tens) of processes on the wafer using a variety different tools, such as exposure tools, bake tools, etch tools, polishing tools, deposition tools, annealing tools, etc. A series of lithography steps are used to create patterned device features in previously deposited and processed layers. Between any two lithography steps, the intervening processes can affect the shape of the wafer. Yet, the wafer generally needs to be as flat as possible for many of the lithography processes, since a lack of flatness can result in a variation in the process as a function of position on the wafer. Such a variation is undesirable because it can lead to defects in the semiconductor devices (e.g. memory chips, logic chips, etc.) being fabricated in the wafer.

For example, if the process is a photolithographic process that involves printing lines for different exposure fields over the wafer, and the wafer has an amount of warpage that is comparable to the depth of focus of the photolithography tool, there can be a variation in the line widths formed over the different exposure fields on the wafer or even within a given exposure field. This variation can contribute to inadequate performance of the semiconductor devices being manufactured and can result in reduced yield.

Unfortunately, it is difficult if not impossible to know how a given processes contributes to the shape of a wafer. This is complicated by the fact that some semiconductor processes involve forming semiconductor structures on both the front-side and the back-side of the wafer.

While wafer flatness measurements can be made in a variety of ways, a very large number of (e.g., a million or more) measurements are needed to obtain adequate data to be able to make an assessment of the process contributions to the shape of the wafer. Interrupting the process flow to make such a large number of measurements has been generally considered impractical because it substantially reduces the throughput of wafers through the manufacturing process (i.e., reduces "throughput"), which results in a substantial increase in the cost-per-wafer.

SUMMARY

Aspects of the disclosure include using full-wafer CGS interferometry to measure the shape (i.e., warpage, non-planarity, distortion, deformation, topography, surface-height variation, etc.) of semiconductor wafers as part of the process flow for fabricating semiconductor devices in the wafers. The CGS interferometer can image the surface of a wafer very precisely, capturing the whole topography of the wafer with, for example, about $3 \times 10^6$ pixels at a speed greater than 100 wafers per hour. The self-referencing configuration of the CGS interferometer allows for shape measurements to be made for wafers having any type of semiconductor structure, and does not require a measurement target. The wafer shape data is analyzed to understand the relationships between surface displacements, stress and wafer shape, as induced by the processes to which the wafer has been subjected.

By comparing the evolution of the wafer shape between process steps in the process flow, shape variations as well as stress can be measured and controlled. Given an established wafer-process flow with a high mix of products (tools), the CGS interferometer measurement system enables rapid understanding of wafer level, die level and within-die topography and stress challenges.

In a foundry environment, the product layout (e.g. through-silicon vias (TSVs), redistribution layers (RDLs), micro-bumps, etc.) and the planarity and stress specifications will vary. The methods disclosed herein allow customized processing (e.g., SPC) of each individual production batch. The planarity and stress measurements can be used to perform process control (e.g., process feedback) to insure that each product yields reliably. The shape measurements can be applied to semiconductor wafers for a variety of process applications, including initial fabrication steps to wafer-level packaging steps.

An aspect of the methods disclosed herein includes the following approach:

1) Making a high-density shape measurement (e.g., $>10^5$ measurements per side or $>10^6$ measurements per side) of one or both sides of a wafer that has either a front-side film or both front-side and back-side films. This can be done using an interferometer-based system, such as a CGS interferometer system.
2) Recognize that front-side and back-side films on the wafer affect in-plane displacements on the front-side and back-side differently (i.e. the factor of −1)
3) Contributions from the front-side and back-side films on the wafer need to be separated to enhance accuracy of the compensation/correction of the alignment of lithographic system
4) The exact approach for the front-side/back-side separation is based on the wafer-shape sampling plan and the nature of the specific processes (i.e. whether they affect front-side stress, back-side stress or both)

5) If wafer shapes can be measured to uniquely isolate front-side and back-side stress contributions to shape (or if the back-side contribution is negligible), then no complementary data is needed.
6) If wafer shapes cannot be measured to uniquely isolate front-side and back-side stress contributions to shape, then complementary data is employed (so-called hybrid metrology). Examples of complementary data may include, but are not limited to:
    a. Alignment mark data
    b. Overlay data
    c. Direct stress/strain measurement
7) Wafer shape measurements and associated separation of front-side and back-side contributions can be applied as follows:
    a. Wafer-to-wafer or Lot-to-lot; interpolated or extrapolated to regions of wafer with low density of alignment or overlay measurements
    b. As a guide for complementary measurements (i.e. determine measurement locations for alignment or overlay measurements)
8) Wafer shape measurements and associated separation of front-side and back-side contributions can be determined periodically with high-density as a reference file or look-up-table for a particular segment of a particular process flow/device.

An aspect of the disclosure is a method of characterizing a shape of a first wafer having a front-side and a back-side and subject to one or more semiconductor manufacturing process steps. The method includes a) prior to performing the one or more semiconductor manufacturing process steps, performing a first coherent-gradient-sensing (CGS)-interferometric shape measurement of a first shape of at least one of the front-side and back-side surfaces of the first wafer according to a wafer-shape sampling plan; b) performing at least one of the one or more semiconductor manufacturing process steps on at least one of the front-side and the back-side of the first wafer; c) performing a second CGS-interferometric shape measurement of a second shape of at least one of the front-side and back-side surfaces of the first wafer after carrying out act b) using the same wafer-shape sampling plan of act a); and d) determining a process-induced change in the shape of the first wafer by comparing the first and second CGS-interferometric shape measurements.

Another aspect of the disclosure is the method described above, the method further includes processing a second wafer using the one or more semiconductor manufacturing processing steps; and altering at least one of the one or more semiconductor manufacturing process steps based on the determined process-induced change in the shape of the second wafer when processing the second wafer.

Another aspect of the disclosure is the method described above, the method further includes adjusting at least one of the one or more semiconductor manufacturing process steps that have not yet been applied to the first wafer based on the determined process-induced change in the shape of the first wafer; and processing the first wafer using the adjusted one or more processes.

Another aspect of the disclosure is the method described above, the method further includes making surface displacement measurements using alignment marks on at least one of the front-side and back-side of the first wafer, and using the surface displacement measurements in act d) of determining the process-induced change in the shape of the first wafer.

Another aspect of the disclosure is the method described above, wherein the first wafer includes front-side alignment marks on the front-side of the first wafer and back-side alignment marks on the back-side of the first wafer. And the method further includes making first measurements of a surface displacement on the front-side of the first wafer using the front-side alignment marks after performing a front-side process step; making second measurements of a surface displacement on the back-side of the first wafer using the back-side alignment marks after performing a back-side process step; using the first and second measurements of the surface displacement to identify respective contributions of the front-side and back-side process steps to the process-induced change in the shape of the first wafer of act d).

Another aspect of the disclosure is the method described above, wherein the first wafer includes front-side alignment marks on the front-side of the first wafer and back-side alignment marks on the back-side of the first wafer. And the method further includes making an overlay measurement using the front-side and back-side alignment marks to identify respective contributions of front-side and back-side process steps to the process-induced change in the shape of the first wafer of act d).

Another aspect of the disclosure is the method described above, the method further includes making a first stress measurement on the front-side of the first wafer after performing a front-side process step; making a second stress measurement on the back-side of the first wafer after performing a back-side process step; and using the first and second stress measurements to identify respective contributions of the front-side and back-side process steps to the process-induced change in shape of the first wafer of act d).

Another aspect of the disclosure is the method described above, wherein the first and second CGS interferometric shape measurements each include front-side and back-side CGS interferometric measurements.

Another aspect of the disclosure is the method described above, wherein the first and second CGS interferometric shape measurements each include only front-side CGS interferometric measurements.

Another aspect of the disclosure is the method described above, wherein the first and second CGS interferometric shape measurements each include only back-side CGS interferometric measurements.

Another aspect of the disclosure is the method described above, wherein the at least one of the one or more semiconductor manufacturing process steps carried out in act b) includes multiple ones of the semiconductor manufacturing process steps carried out on a single lithography tool.

Another aspect of the disclosure is the method described above, wherein the at least one of the one or more semiconductor manufacturing process steps carried out in act b) includes multiple ones of the semiconductor manufacturing process steps carried out on different lithography tools.

Another aspect of the disclosure is the method described above, wherein act b) includes forming a semiconductor structure on at least one of the front-side and back-side of the first wafer.

Another aspect of the disclosure is the method described above, wherein act b) includes processing an existing semiconductor structure on at least one of the front-side and back-side of the first wafer.

Another aspect of the disclosure is the method described above, wherein the first and second CGS-interferometric shape measurements each includes at least $10^6$ data points.

Another aspect of the disclosure is the method described above, wherein the first and second CGS-interferometric shape measurements each includes between $1 \times 10^5$ data points and $5 \times 10^6$ data points.

Additional features and advantages of the disclosure are set forth in the detailed description that follows, and in part will be readily apparent to those skilled in the art from that description or recognized by practicing the disclosure as described herein, including the detailed description that follows, the claims, and the appended drawings. The claims are incorporated into and constitute part of the detailed description of the disclosure.

It is to be understood that both the foregoing general description and the following detailed description present embodiments of the disclosure and are intended to provide an overview or framework for understanding the nature and character of the disclosure as it is claimed. The accompanying drawings are included to provide a further understanding of the disclosure and are incorporated into and constitute a part of this specification. The drawings illustrate various embodiments of the disclosure and together with the description serve to explain the principles and operations of the disclosure.

BRIEF DESCRIPTION OF THE DRAWINGS

FIG. 1B is a cross-sectional view of a prior art example wafer with a front-side film, illustrating the surface displacements due to stress and to bending for the case of simple bending;

FIGS. 2A-2C are contour plots of the wafer shape that plot the surface position or height u(x,y) as a function of the (x,y) positions (mm), wherein FIG. 2A plots the post-process topography, FIG. 2B plots the pre-process topography, and FIG. 2C plots the difference between the plots of FIGS. 2A and 2B to arrive at the processed-induced topography;

FIGS. 7A and 7B are topography maps of an unchucked wafer (FIG. 7A) and a chucked wafer (FIG. 7B) that shows residual stress;

Cartesian coordinates are shown in some of the Figures for the sake of reference and are not intended as being limiting as to orientation or configuration.

DETAILED DESCRIPTION

Reference is now made in detail to the present preferred embodiments of the disclosure, examples of which are illustrated in the accompanying drawings. Whenever possible, the same reference numbers and symbols are used throughout the drawings to refer to the same or like parts. The claims are incorporated into and constitute part of this detailed description.

In the discussion below, the term "shape" as used to describe a wafer means the surface shape or topography or curvature or surface height as a function of the (x,y) coordinates of the wafer surface, or warpage, or non-planarity or deformation, etc. In an example, the shape can be defined in terms of a height function w(x,y), where the height is measured in the z-direction. The surface shape of a wafer gives rise to an associated in-plane displacement of the (x,y) wafer surface points as compared to a perfectly flat wafer surface where the in-plane displacements parallel to the x and y axes of a Cartesian coordinate system are denoted as u(x,y) and v(x,y) respectively.

CGS Interferometer System

Figure 1A:
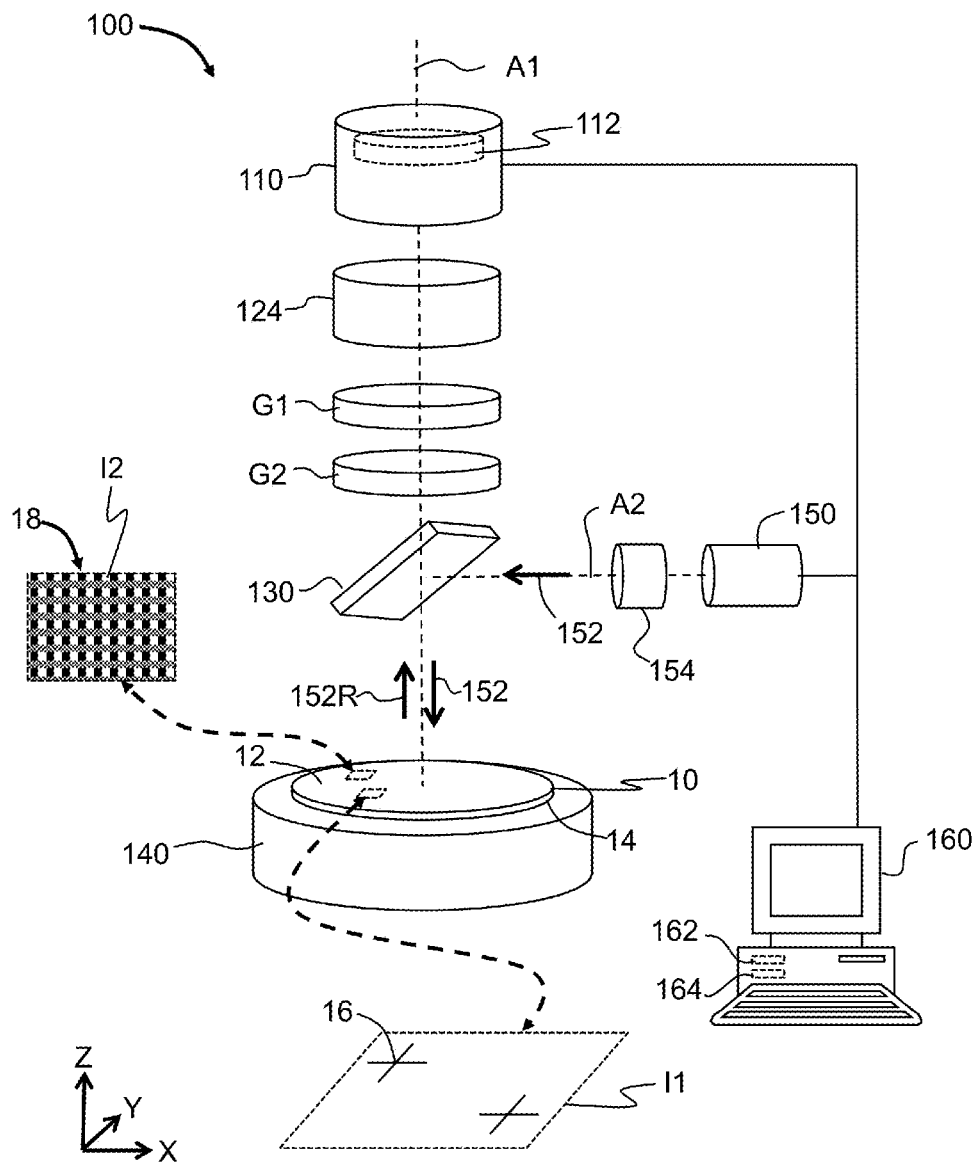
FIG. 1A is a schematic diagram of an example coherent gradient sensing (CGS) system that is used in an example to carry out the CGS interferometric measurements that are part of the methods disclosed herein.

FIG. 1A is a schematic diagram of an example coherent-gradient sensing (CGS) interferometer system ("CGS system") 100 that can be used to measure the curvature C(x,y) of a wafer 10 having an upper surface 12. The details about how CGS works are described in the above-cited U.S. Pat. No. 6,031,611 (the '611 patent). FIG. 1A is based on FIG. 1 of the '611 patent.

The CGS system 100 is based on the principles of lateral shearing interferometry. The CGS system 100 and includes, along an axis A1, a digital camera 110 having an image sensor 112, a filtering lens 124 (e.g., a filter in combination with a lens, as discussed in the '611 patent and shown in FIG. 1 therein), first and second axially spaced-apart diffraction gratings G1 and G2, a beamsplitter 130, and a wafer stage 140. The CGS system 100 also includes a laser 150 arranged along an optical axis A2 that intersects the axis A1 at the beamsplitter 130. A beam expander/collimator 154 is arranged along the optical axis A2 in front of the laser 150.

The CGS system 100 also includes a controller or signal processor 160 operably connected to the digital camera 110 and to the laser 150. An example controller or signal processor 160 is or includes a computer having a processor 162 and a non-transient computer-readable medium ("memory") 164, which are configured via instructions recorded thereon to control the operation of the CGS system 100 to perform measurements of wafer 10 and carry out the methods described herein.

The wafer 10 has an upper surface 12 and a lower surface 14. In an example, one or both of the upper surface 12 and the lower surface 14 includes alignment marks 16, as shown in the close-up inset 11. The wafer 10 can also include semiconductor features or structures 18 formed on at least one of the upper and lower surfaces 12 and 14, as shown in the close-up inset 12. In an example, an example structure can include a film or stack of films. An example structure can also include patterned features, such as formed using a lithographic process in a lithographic layer, e.g., a dielectric material, or a metal material or a combination of such materials.

With continuing reference to FIG. 1A, in operation, the laser 150 and beam expander/collimator 154 form a collimated probe beam 152 that is directed to the upper surface 12 of wafer 10 by the beamsplitter 130. The collimated probe beam 150 has a diameter of at least the diameter of wafer 10, which can have a diameter of 300 mm for example.

The collimated probe beam 152 reflects from the upper surface 12 of the wafer 10 as a reflected light 152R, which travels upwards through the beamsplitter 130 and through the first and second axially spaced-apart diffraction gratings G1 and G2. The two diffraction gratings G1 and G2 are spaced apart and otherwise configured to shear the reflected light 152R. The reflected light 152R passing through the two diffraction gratings G1 and G2 is then focused onto the image sensor 112 of digital camera 110 using the filtering lens 124.

Because the collimated probe beam 152 illuminates the entire wafer 10 at once, the wafer stage 140 does not need to perform x/y motion to complete the measurement. The reflected light 152R that reflects off of the upper surface 12 of the wafer 10 is distorted in accordance with the local height variations (i.e., warpage) of the wafer 10. The interference is generated in a self-referencing manner when the distorted reflected light 152R is steered though the two diffraction gratings G1 and G2. The self-referencing approach eliminates the need for an independent reference beam from, for example, a flat mirror and ensures excellent fringe contrast regardless of the reflectivity of the surface under investigation. The interference patterns are imaged on to the image sensor 112, which in an example includes a 2048×2048 CCD sensor array.

The CGS system 100 essentially compares the relative heights of two points on the upper surface 12 of wafer 10 that are separated by a fixed distance ω, which is called the shearing distance. Physically, the change in height over a fixed distance provides slope or tilt information, and the fringes in a CGS interference pattern are contours of constant slope. For a given probe wavelength λ and grating pitch p for the two diffraction gratings G1 and G2, the shearing distance scales with the distance between the two diffraction gratings G1 and G2. The sensitivity of the interferometer or the slope per fringe is determined by the ratio of the probe wavelength λ to the shearing distance ω.

To reconstruct the shape (and thus the warpage) of the upper surface 12 of wafer 10 under investigation, interference data in two orthogonal directions must be collected. Collection of the slope data in the x-direction and y-direction is achieved in parallel by two independent grating and camera sets, such as disclosed in the '611 patent. The slope data derived from the interference patterns is integrated numerically to generate the surface shape or topography of wafer 10.

In an example, for each direction, a series of 10 phase-shifted interference patterns are collected at 45-degree increments in phase. The phase shifting is achieved by moving the two diffraction gratings G1 and G2 in the direction parallel to the shearing direction. The phase shifting provides several advantages. For patterned wafer measurement, the most notable advantage is that the fringe contrast can be effectively separated from the pattern contrast, which is static with the phase shifting. The phase shifting, along with the inherent self-referencing nature of the CGS technique, results in relatively high measurement integrity on patterned wafers with widely varying nominal reflectivity. There is no need for dedicated or distinct targets, pads or other specialized features in the layout on the upper surface 12 of wafer 10.

The mapping of a 300 mm wafer 10 onto an image sensor 112 having the aforementioned 2048×2048 sensor array results in each pixel corresponding to a square area of approximately 150 microns on the upper surface 12 of wafer 10. As a result, a 300 mm upper surface 12 of wafer 10 is mapped with greater than $3 \times 10^6$ data points with measurement times of just a few seconds. This constitutes a high-density shape measurement.

For maximum system throughput, the 2048×2048 CCD array results can be down-sampled to a 1024×1024 array, resulting in a square area of approximately 300 microns on the upper surface 12 of wafer 10, which allows for a throughput for the CGS system 100 of greater than 100 wafers per hour (wph). The down-sampled data result in a 300 mm upper surface 12 of wafer 10 being mapped with approximately 800,000 data points. This down-sample data still represents a high-density shape measurement.

Note that for stress-induced wafer bending, the shortest in-plane length scale over which a wafer 10 can deform is twice its thickness. As such, the 300 micron pixel size adequately characterizes deformation of a typical 300 mm wafer 10 whose thickness is 775 microns, and higher resolution with a pixel size of approximately 150 micron pixel size can be used for thinned wafers as required.

The CGS system 100 has advantages for measuring the shape of wafer 10 as compared to traditional interferometers that measure z-height. First, the self-referencing nature of the CGS technique provides high-contrast fringes regardless of the nominal reflectivity of the upper surface 12 of wafer 10 because the two beams that are interfered have similar intensity. Traditional interferometers that rely on a reference surface may lose fringe contrast if the reference beam is significantly brighter than the probe beam due to a low-reflectivity wafer. Second, for typical wafer deformations of tens to hundreds of microns, the CGS fringes have width and spacing much larger than typical pattern features. Such fringe patterns are much more robust for common fringe analysis techniques because the CGS fringes are reasonable smooth and continuous across the entire wafer 10. Traditional interferometers may have fringe patterns that become discontinuous and difficult to resolve in the presence of patterning making fringe analysis challenging if not impossible.

It is noted that wafer shape characterization has typically relied on point-by-point measurements to generate low-density maps of the wafer geometry with a few hundred data points at most. The CGS system 100 enables patterned wafer inspection that can provide an entire wafer map with greater than $5 \times 10^5$ pixels (data points), e.g., up to about $3 \times 10^6$ pixels (data points) per wafer, with a resolution of about 75 microns per pixel. In an example, the number of data points is in the range from $5 \times 10^5$ to $5 \times 10^6$.

The full-wafer CGS interferometer can image precisely the upper surface 12 of the wafer 10 in a few seconds, enabling 100% in-line monitoring of individual wafer shape. Its self-referencing feature allows the inspection to be made on any type of surface or films stack, and does not require a measurement target. This capability can be applied for MEOL and BEOL process monitoring for a variety of applications, including wafer warpage, process induced topography for TSV and other critical steps to control process induced yield issues.

Computing Thin-Film Stress

The cumulative stress $\sigma_f$ in a layer of material can be computed from the process-induced change in substrate curvature $\Delta \kappa$ using the well-known Stoney formula:

$$\sigma_f = \frac{M_s h_s^2}{6 h_f} \Delta \kappa \tag{A}$$

where $M_s$ is the biaxial modulus of the substrate (wafer), $h_s$ is the thickness of the substrate and $h_f$ is the film or layer thickness. The assumptions of the Stoney formula include that the film or layer is homogeneous, continuous and thin relative to the substrate and that the stress, and hence curvature change, is spatially uniform.

For most practical semiconductor devices, these assumptions are not realized. Device structures are inherently heterogeneous and discontinuous, whereas stresses and curvatures vary spatially due to process non-uniformities. Even so, more complex analyses of simple device structures and spatially varying stress fields have shown that equation (A) is recovered for the case of a thin, continuous film of uniform stress.

To first order, the analysis of the details of the device structure and stress non-uniformities result is a multiplication factor to the original Stoney equation. As a result, for a specific device structure and process-history, the Stoney formula still provides a reasonably accurate representation of relative stress variations across the substrate despite of the simplifying assumptions.

The measured surface topography and slopes can be thought of as comprised of 'uniform stress' and 'non-uniform stress' components. Note from equation (A) that constant stress across the wafer 10 is associated with constant curvature, defined as the second derivative of surface height w. A constant curvature implies that the topography w can be described by a second order equation (i.e. a parabolic surface) and the slopes by a first order equation (i.e. a plane). Therefore, a best-fit plane to the measured slope fields describes the 'uniform stress' component, whereas the residuals from that fit (measured minus best-fit plane) represents the 'non-uniform stress' component.

Lower spatial frequency deformation, generally associated with uniform stress, can be eliminated when a wafer is chucked in a lithography tool. However, non-uniform stresses occurring at higher spatial-frequencies cause deformation and distortions that cannot be completely eliminated during chucking. Non-uniform stress, therefore, can lead to issues for lithography or any other process that relies on the wafer 10 being as flat as possible.

Computing in-Plane Displacements

In-plane surface displacements in the x- and y-directions can be computed from the surface topography using fundamentals of plate theory. Specifically, the displacements are proportional to the local surface slopes or tilts. FIG. 1B is a cross-sectional view of a prior art example wafer with a front-side film, illustrating the case of simple bending, wherein the neutral axis of the substrate of thickness, h.sub.s is the mid-plane or h.sub.s/2 from the either surface of the substrate. The neutral axis is defined as the plane over which the in-plane stresses are zero.

When a stressed thin film structure is fabricated on one of the substrate surfaces, the neutral axis is located $2h_s/3$ below the substrate surface with the stressed thin-film structure for the conditions associated with the development of the Stoney equation (A). The distance between the substrate surface and the neutral axis represents a 'lever-arm' over which in-plane displacements are introduced on that substrate surface for a given local slope or tilt. When the substrate is chucked flat for lithographic processing, the in-plane displacements resulting from stresses induced during prior processing are removed partially by bending.

The difference in the neutral axes (i.e. $\frac{1}{6} * h_s$) for these two physical processes (thin-film stress versus bending) result in a residual in-plane displacement. The surface displacements directly impact the relative position of all locations on the surface of wafer 10, thereby leading to possible alignment issues across the wafer 10 at lithography. Uniform stresses lead to in-plane displacements that can be compensated for during the lithographic process using standard offsets for in-plane shift, magnification and rotation. On the other hand, displacements associated with non-uniform stresses may be significantly more difficult to eliminate using standard compensation techniques.

Figure 1C:
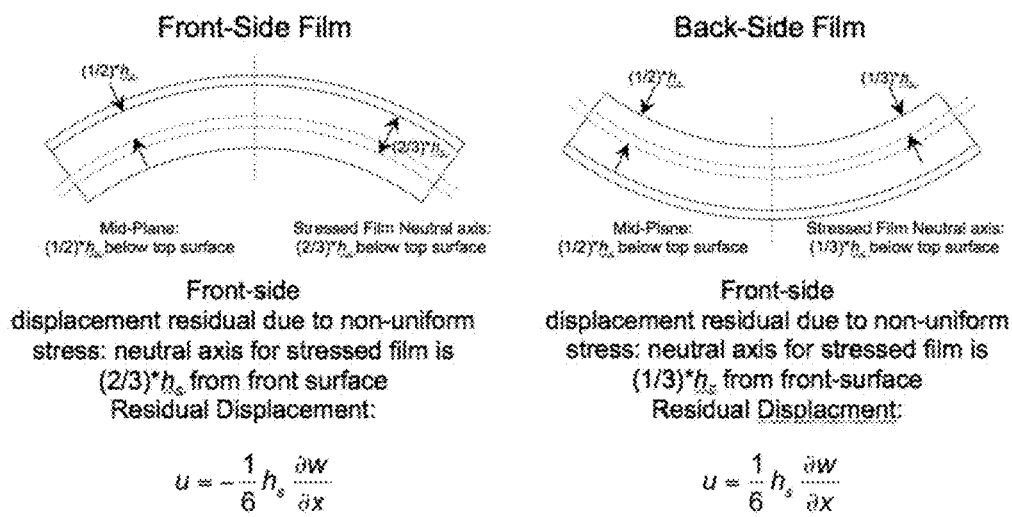
FIG. 1C is similar to FIG. 1B but for the case where the wafer includes both front-side and back-side films.

FIG. 1C is similar to FIG. 1B and shows the case of a wafer having both front-side and back-side films. During semiconductor processing, thin films are often introduced on the back-side or non-patterned surface of the substrate. In some cases, these stressed films are introduced intentionally to control overall warpage of the substrate. During subsequent processes, the stresses of the back-side films may be modified. For example, an anneal process may affect the stress back-side film or alternately the back-side film may be etched or stripped which would relax the warpage caused by the stressed film.

The surface on which a stressed film is located will affect the resulting displacements on the front-surface that is of interest for lithographic patterning. As noted in the previous paragraph, the residual in-plane displacement on the front-surface of the substrate due to stress non-uniformities of front surface film will be the difference in neutral axes positions: $[(-\frac{2}{3})-(-\frac{1}{2})]*h_s$ or $(-\frac{1}{6})*h_s$. When the stressed film is located on the back surface of the substrate, the difference in neutral axes positions is instead: $[(-\frac{1}{3})-(-\frac{1}{2})]*h_s$ or $(\frac{1}{6})*h_s$. In other words, for a the same magnitude of substrate deformation and hence the same front-surface slopes, the calculated in-plane displacements due to a back-surface stressed film will be −1 times that due to a front-surface stressed film.

For a given measured wafer shape or change in wafer shape, the presence of stressed films on both sides of a substrate complicates the determination of the in-plane displacements arising from stress. If the displacement information is to be used as part of a process control strategy for lithographic alignment, it is therefore necessary to implement a method to differentiate between the deformations induced by thin film stresses on each side of the substrate.

For back-end applications, thinned wafers 10 can pose a significant challenge. If the equation (A) is re-arranged in terms of curvature change, it can be seen that for the same stress, the curvature will increase inversely with the square of wafer thickness. As a result, stress non-uniformities for thinned wafers will be associated with greater and greater deformation amplitudes that will impact subsequent processing.

Wafer Shape Monitoring During Process Flow

As noted above, by measuring the evolution of process-induced topography changes across multiple process steps in a process flow, the role of topography variations on parameters such as lithographic alignment, defocus, device performance and yield can be evaluated. Process control strategies can be implemented to reduce or minimize the process variations or alternatively the wafer deformation information can be used in feed-backward or feed-forward to modify process parameters to control or compensate for excessive deformation.

The wafer level and local topography can also vary significantly dependent on the use of multiple process tools and in particular different process tools (e.g., exposure tools, etch tools, bake tools, annealing tools, polishing tools, etc.).

Thus, an aspect of the methods disclosed herein include making CGS-interferometric measurements on a first wafer 10 to determine a process-induced change in surface shape of the wafer 10 that has undergone at least one semiconductor fabrication process or step, and then making adjustments to the at least one semiconductor fabrication process or step for subsequent (i.e., a second) wafer 10 to improve the semiconductor processing of the subsequent wafer 10 in the process. The methods can also include adjusting downstream processes for processing the first wafer 10 based on the process-induced surface shape that occurred in the upstream process.

A detailed topography map obtained using the CGS system 100 can contain information spanning a range of spatial wavelength, from twice the pixel size to the wafer scale. The analysis of topography variations occurring at different spatial wavelengths can be beneficial for a range of applications. For example, residual topology maps can be generated to investigate wafer topology after chucking the wafer 10 on a vacuum wafer chuck. The low-order formation associated with uniform stress and wafer bow can be modeled and removed using filtering or surface fitting techniques. The remaining or residual topography due to non-uniform stresses can be used to evaluate the topography of the wafer 10 after chucking.

For example, FIGS. 2A-2C are contour plots of surface position or height u(x,y) as a function of the (x,y) positions (mm) for an example wafer 10, illustrating changes in wafer shape due to processing of the wafer 10. FIG. 2A plots the post-process topography, FIG. 2B plots the pre-process topography, and FIG. 2C plots the difference between the plots of FIGS. 2A and 2B to arrive at the processed-induced topography.

Figure 3A:
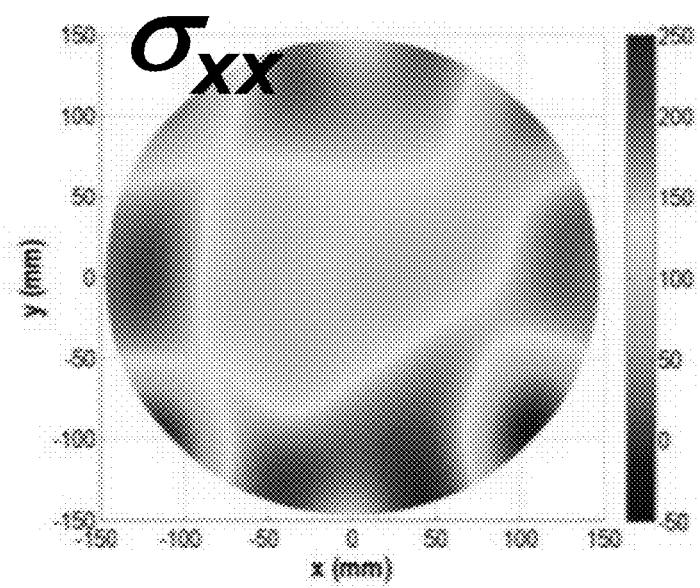
FIGS. 3A and 3B are stress maps for $\sigma_{xx}$ (FIG. 3A) and $\sigma_{yy}$ (FIG. 3B) for 300 mm wafers having passes through a high-stress front end of the line (FEOL) process, wherein the stress scale runs from −50 MPa to 250 MPa.
Figure 3B:
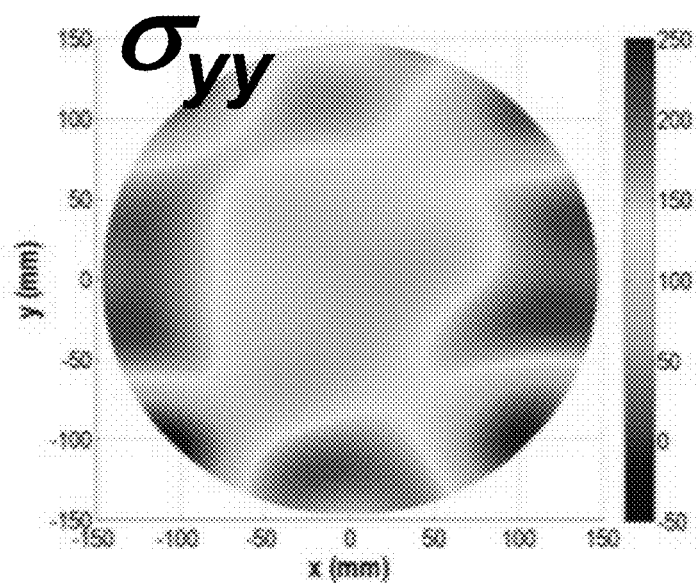

FIGS. 3A and 3B are stress maps for $\sigma_{xx}$ (FIG. 3A) and $\sigma_{yy}$ (FIG. 3B) for 300 mm wafers having passes through a high-stress front end of the line (FEOL) process, wherein the stress scale runs from −50 MPa to 250 MPa, wherein the stress maps correspond to the surface topography.

Figure 4:
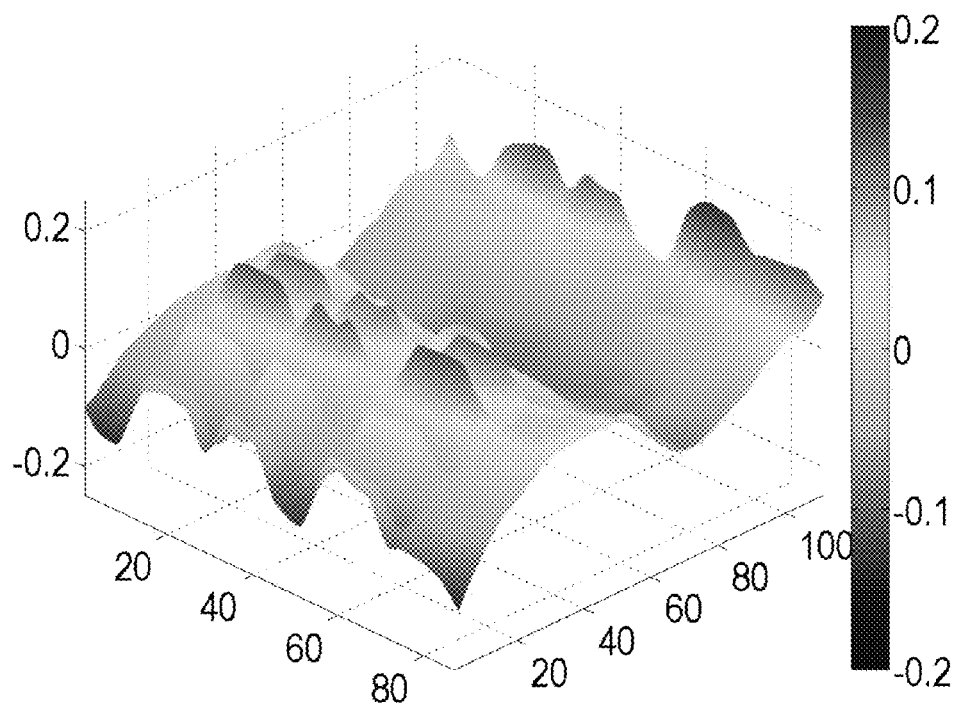
FIG. 4 is a plot of an example of localized chip-level topography map, wherein the height scale runs from −0.2 microns to 0.2 microns.

FIG. 4 is a plot of an example of localized chip-level topography map, wherein the height scale runs from −0.2 microns to 0.2 microns.

Figure 5A:
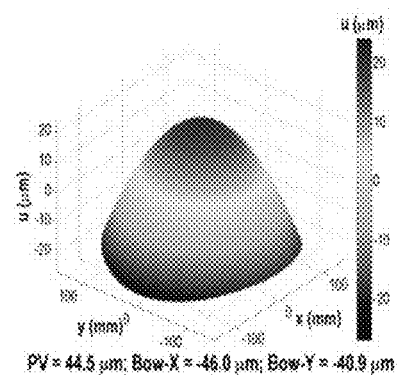
FIGS. 5A-5D are example topography maps for four different chip process levels, namely film deposition (FIG. 5A), anneal (FIG. 5B), etch (FIG. 5C) and strip (FIG. 5D)
Figure 5B:
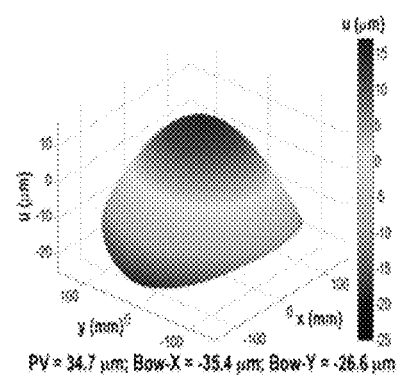
Figure 5C:
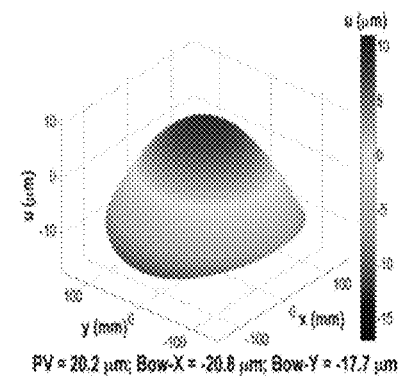
Figure 5D:
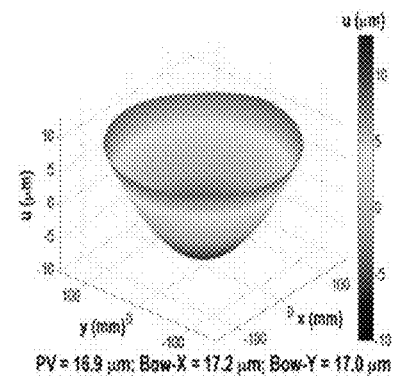
Figure 6A:
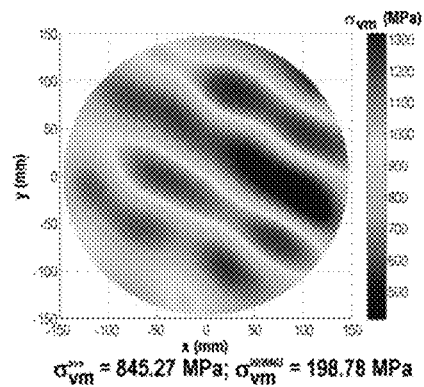
FIGS. 6A-6D are example stress maps measured prior to anneal from four different tools with the same product and process flow.
Figure 6B:
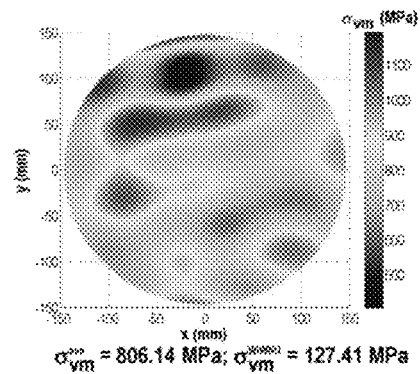
Figure 6C:
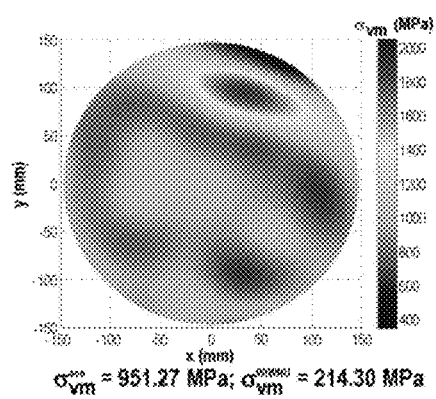
Figure 6D:
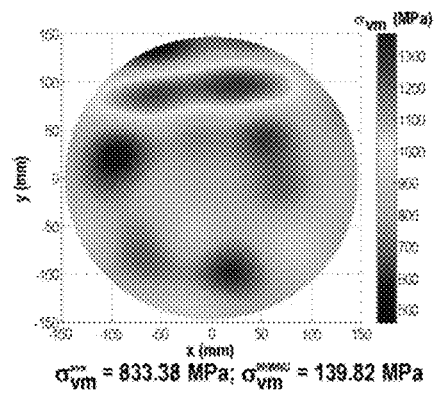

FIGS. 5A-5D are example topography maps for four different chip process levels, namely film deposition (FIG. 5A), anneal (FIG. 5B), etch (FIG. 5C) and strip (FIG. 5D);

FIGS. 6A-6D are example stress maps measured prior to anneal from four different tools with the same product and process flow, where the stress maps correlated to topography maps.

FIGS. 7A and 7B are topography maps of an unchucked wafer (FIG. 7A) and a chucked wafer (FIG. 7B) that shows residual stress and thus residual topography.

An aspect of the disclosure is directed to making shape measurements of a wafer and using those shape measurements to compute displacements, and use the computed displacements as part of an overlay/lithographic alignment control strategy. In an example, a cumulative surface displacement that occurs between two lithography steps is measured, where the patterning of the later lithography step is aligned to the patterning of the earlier process step (not necessarily subsequent lithography steps). This process can make use of the alignment marks 16.

Processes that involve deposition of stressed films or the change of the stress of previously deposited films/structures may affect the displacement of a given (x,y) position on the wafer 10. Displacement due to stress non-uniformity in front-side films or back-side films must be isolated to accurately determine the total displacement due to a series of processes. This can be accomplished by one or more measurements of shape. Depending on the attributes of the individual processes in the sequence and the sampling plan, the measurements of shape alone may be sufficient to determine the front-side/back-side contributions to the total displacement; if not complementary data will be required. It should be noted that there may be process sequences for which the in-plane displacements due to back-side films may be negligible compared to those associated with front-side films.

General Wafer-Shape Monitoring Method

Figure 8:
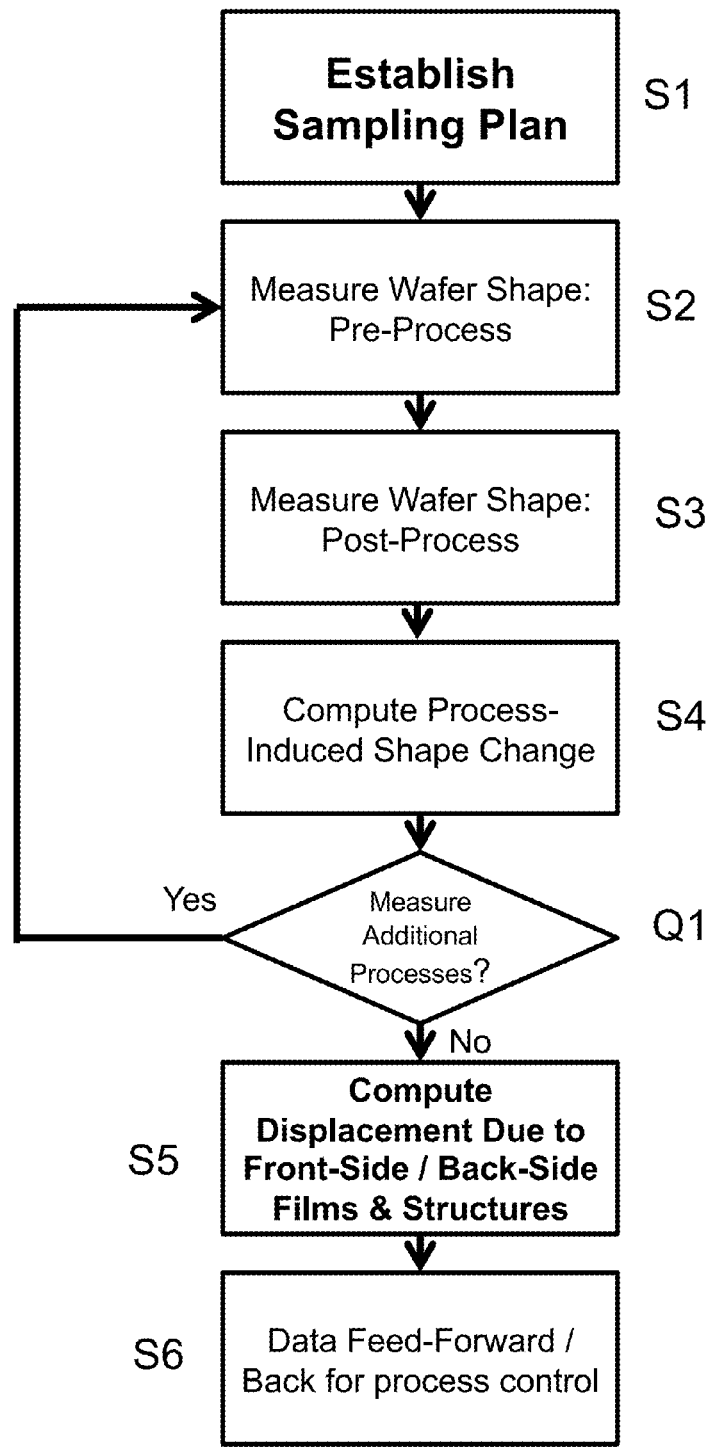
FIG. 8 is a flow diagram that illustrates an example method of wafer shape monitoring during process flow.

FIG. 8 is a flow diagram that illustrates an example method of wafer shape monitoring during process flow. The method includes a step S1 of establishing a sample plan, as discussed in greater detail below. The method then includes a step S2 of measuring the wafer shape before processing, i.e., pre-process. The method then includes a step S3 of measuring the wafer shape after processing, i.e., post-process. The method then includes a step S4 of computing a process-induced shape change. The method then includes a query step Q1 that asks whether additional processes are to be measured. If the answer is "yes," then the method returns to step S2 and the steps S2 through S4 are repeated for the additional process. If the answer is "no," then the method proceeds to a fifth step S5 of computing a displacement due to front-side or back side films and structures. This fifth step S5 is explained in greater detail below.

The method then proceeds to a sixth step S6 of using the results ("data") of fifth step S5 to control the process, e.g., by making adjustments to the processes that reduce the amount of wafer shape variation. This can include a feed-forward or feed-back step to enable subsequent processes to compensate for wafer shape.

Figure 9:
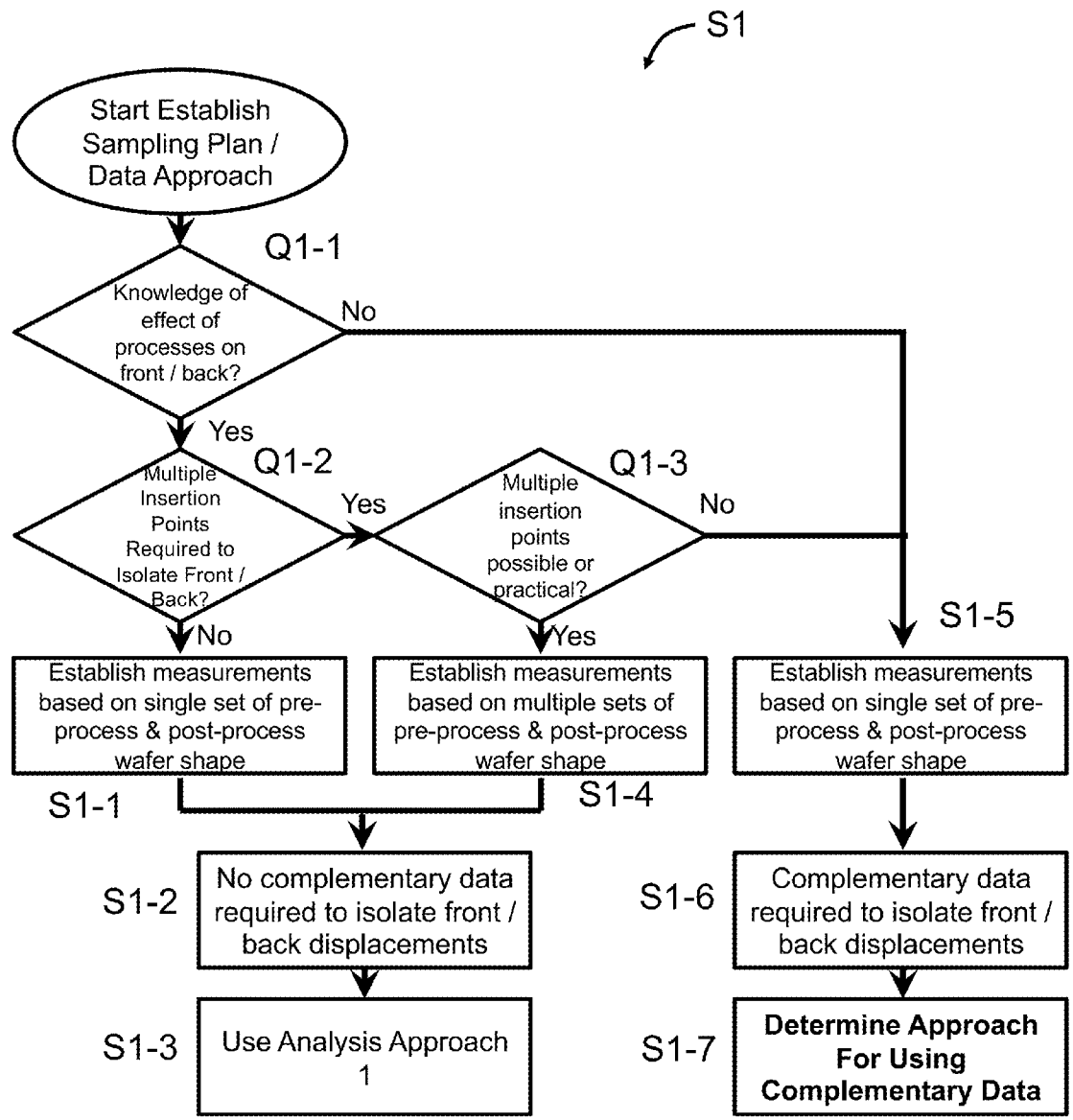
FIG. 9 is a flow diagram that shows the details of step S1 of establishing a sampling plan for making surface shape measurements

FIG. 9 is a flow diagram that describes example steps S1 of the flow diagram of FIG. 8 of establishing a sampling plan. The sampling plan generally includes a combination of a priori knowledge of which steps affect the stress of the films or structures on the front-side or back-side of the wafer 10 and the practicality of making multiple combinations of post-process and pre-process shape measurements. The flow diagram of FIG. 9 includes four main paths P1 through P4. Other paths or variations of the paths through the flow diagram of FIG. 9 may be possible, depending on the process, a priori knowledge of front-side and back-side shape measurements, etc.

Figure 10A:
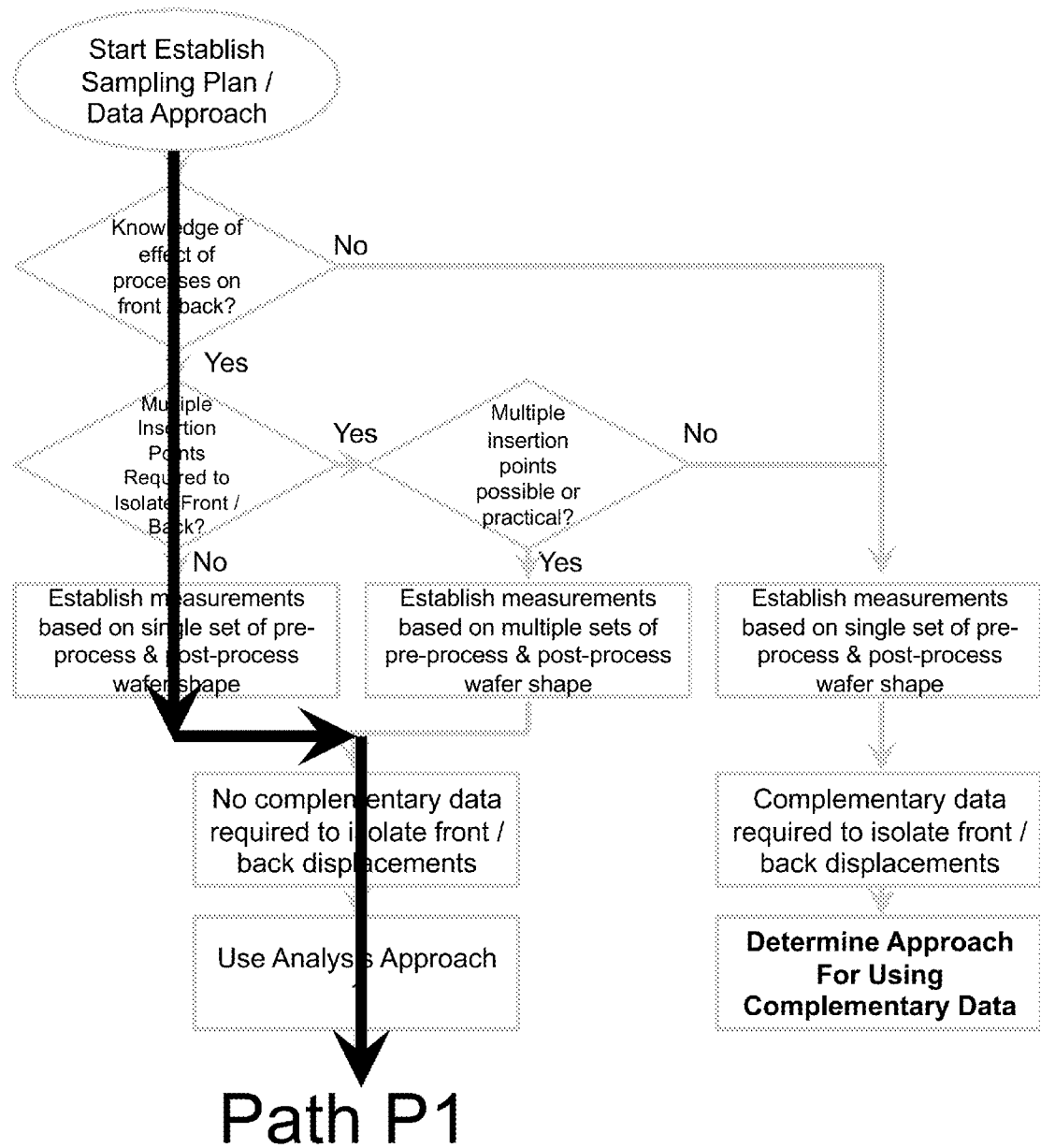
FIGS. 10A through 10D show four different paths P1 through P4 through the flow chart of FIG. 9 thereby illustrating four different approaches for establishing a sampling plan.
Figure 10B:
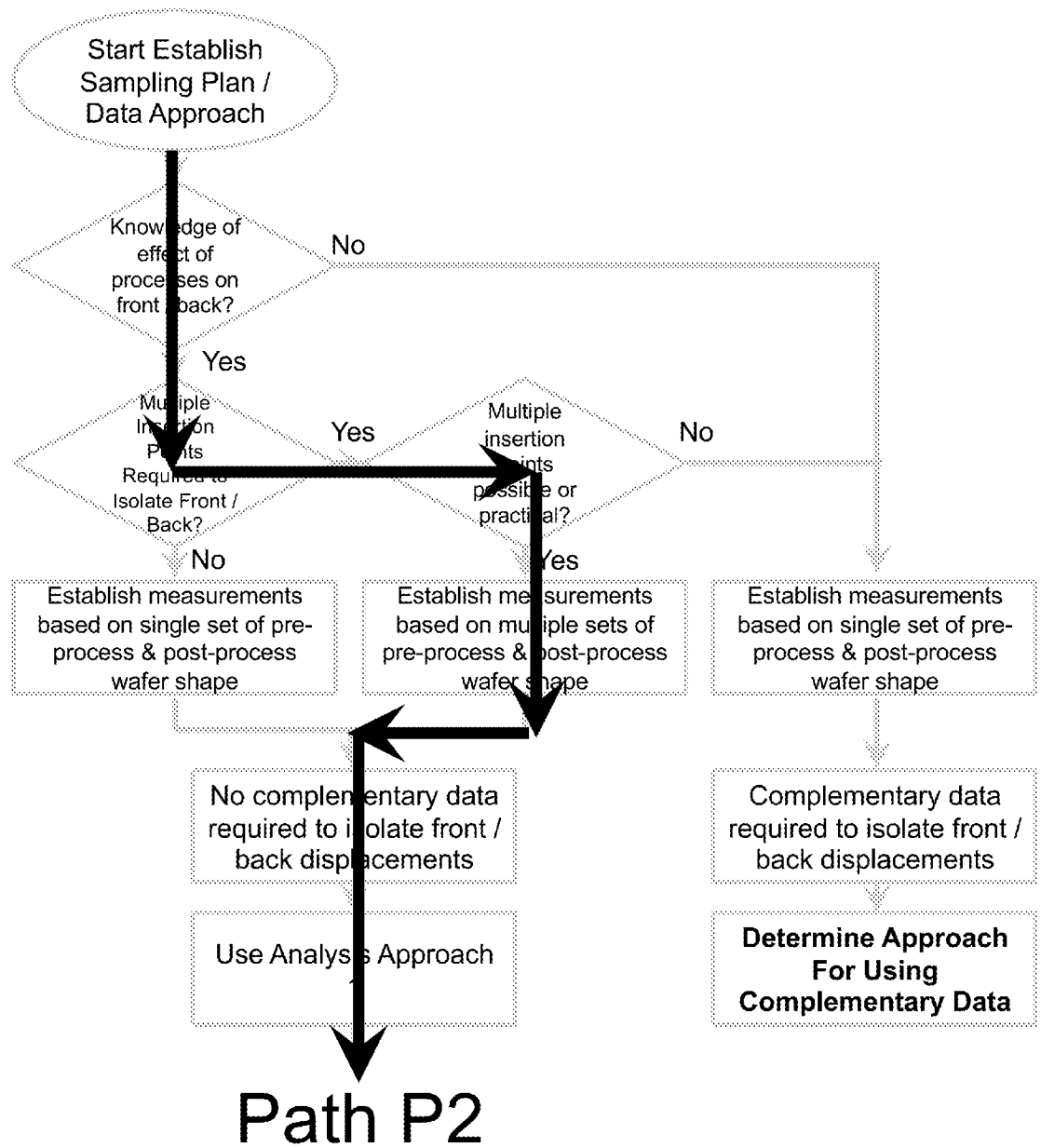

With reference to FIG. 9 and also to FIG. 10A that shows the first path P1, in an example, the method of establishing a sampling plan follows a first path that includes a first query step Q1-1 that inquires whether there is any knowledge or information regarding the effect the processes on the front or back sides of the wafer 10. If the answer to this first query step Q1-1 is "yes," then the method proceeds to a second query step Q1-2, which asks whether multiple insertion points are required to isolate the front and back surface shape contributions. Insertion points are places where a single shape measurement is made.

If the answer to the second query step Q1-2 is "no," then the method proceeds to step S1-1 that involves establishing measurements based on a single set of pre-process and post-process wafer shapes. The Step S1-1 is followed by a step S1-2 that recognizes that no complementary data is required to isolate front-side and back-side displacements. The scenarios that do not require complementary data either involve sufficient shape measurements to uniquely isolate deformation due to front-side and back-side thin film stresses. As shown in FIG. 10A, the method moves to a step S1-3 that establishes a first sampling plan based in a first analysis as described below.

With reference now to FIG. 10E3 that shows the second path P2 through the flow diagram of FIG. 9, if the answer to the first query step Q1-1 is "yes" and the answer to the second query step Q1-2 is "yes," then the method proceeds to a third query step Q1-3, which asks whether multiple insertion points are practical or possible. If the answer to this third query step Q1-3 is "no," then the method proceeds to a step S1-4 of establishing a wafer shape based on multiple sets of pre-process and post-process wafer shape measurements. The method step S1-4 then feeds into method steps S1-2 and S1-3 as described above that uses a second sampling plan and a second analysis approach as described below.

Figure 10C:
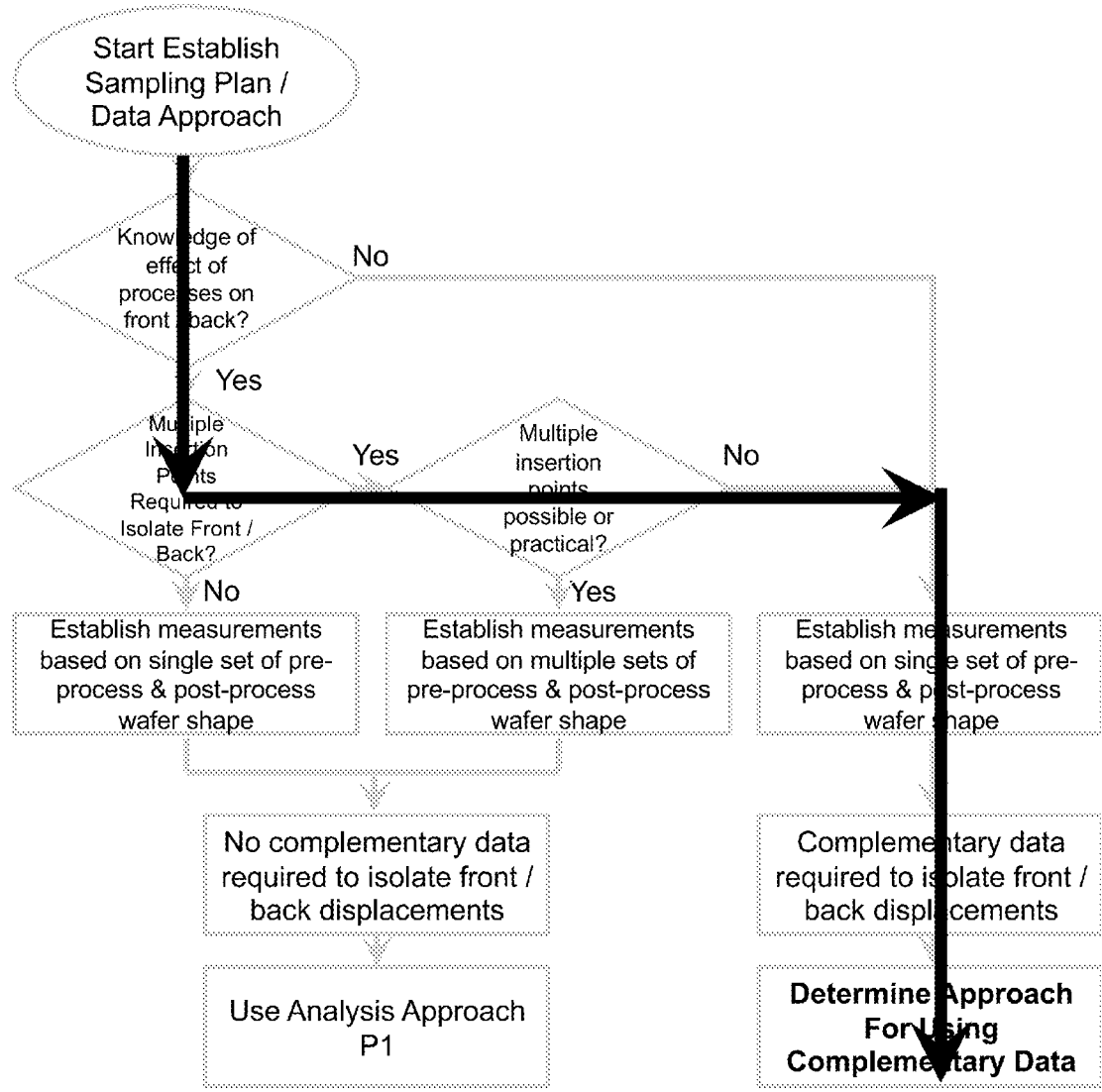

With reference now to FIG. 10C that shows the third path P3 through the flow diagram of FIG. 9, if the answer to the first query step Q1-1 is "yes," the answer to the second query step Q1-2 is "yes," and the answer to the third query step Q1-3 is "no," then the method proceeds along the third path P3 that includes method steps S1-5 through S1-7. The step S1-5 includes establishing measurements based on a single set of pre-process and post-process wafer shapes, while the step S1-6 involves obtaining complementary data to isolate the front-side and back-side displacements. The step S1-7 involves determining an approach for using the complementary data of step S1-6. Details of the step S1-7 are described in greater detail below. The third path P3 involves a third sampling plan and a third analysis approach, as described below.

Figure 10D:
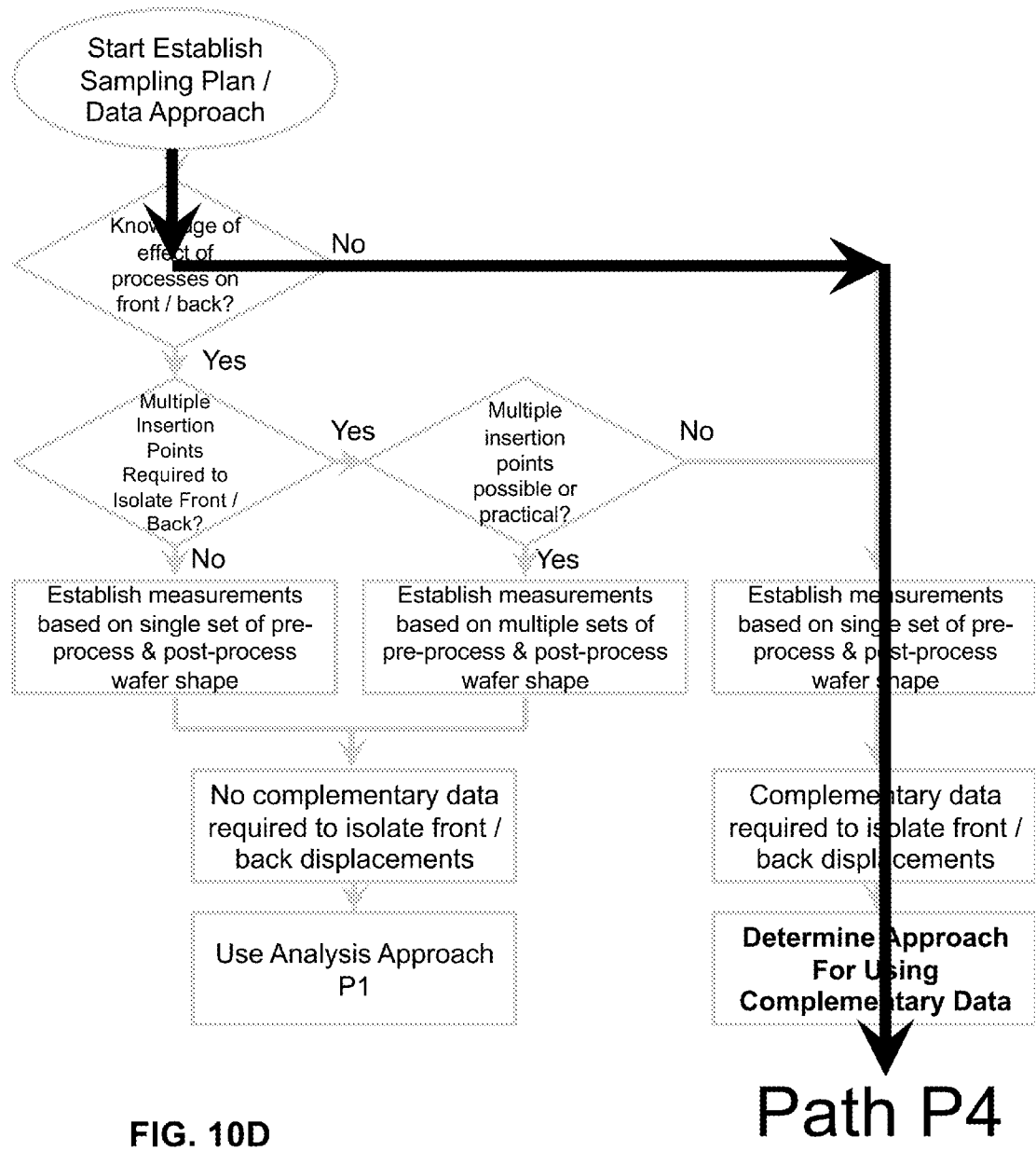

With reference to FIG. 10D that shows the fourth path P4 through the flow diagram of FIG. 9, if the answer to the first query step Q1-1 is "no," then the method proceeds directly to the steps S1-5 through S1-7. The fourth path P4 involves a fourth sampling plan and a fourth analysis approach, as described below.

Sampling Plans for Path P1 Through P4

FIG. 11A through 11D are schematic diagrams that illustrate sampling plans according to the path P1 through P4, respectively, of the flow diagrams of FIGS. 9 and 10A through 10D, respective.

Figure 11A:
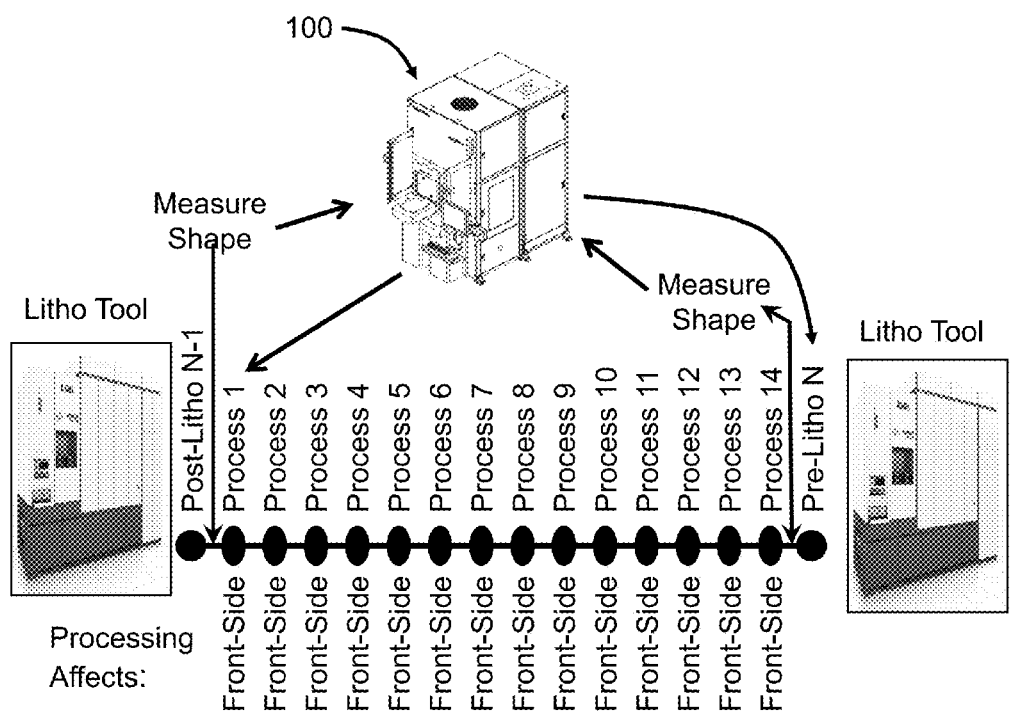
FIGS. 11A through 11D are schematic diagrams that respectively correspond to the sampling plan paths P1 through P4 and show an example wafer process that includes fourteen individual processes.

FIG. 11A shows two lithography ("litho") tools, which can be the same litho tool, and shows a number (e.g., 14) front-side process steps after a $(N-1)^{th}$ litho process ("Post-Litho N−1) and before an $N^{th}$ litho process ("Pre-Litho N"). Shape measurements are made before front-side process 1 and after front-side process 14 using the CGS system 100, which shown in FIG. 11A but omitted from FIGS. 11B-11D for ease of illustration.

The assumption for path P1 is that all processing occurs in a single side of the wafer 10, such as the front side, and thus has an effect on surface shape on only due to stresses induced on the front side of the wafer 10.

Figure 11B:
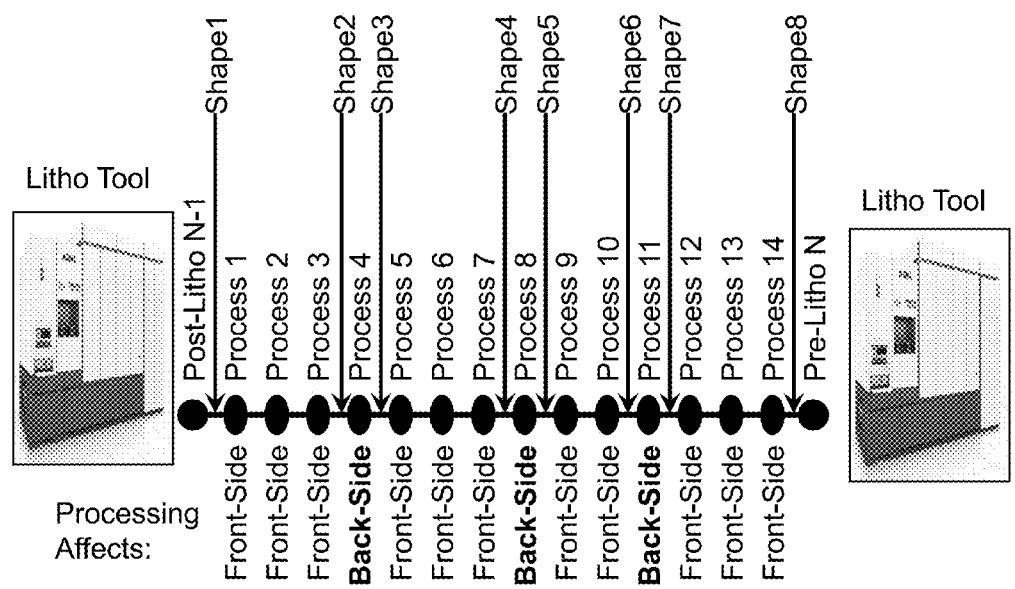

FIG. 11B is similar to FIG. 11A and shows the addition of shape measurements that occur between back-side processes. Individual processes distinctly affect a single side of the wafer 10, with some modifying front-side and others modifying back-side films/structures Shape measurements at multiple points in the process flow are acceptable/practical. The measurement points are chosen to isolate the individual processes or groups of processes that modify a single side of the wafer 10. The difference between two subsequent shape measurements corresponds to the process-induced change due to modifications of the front-side only or back-side only. The calculation is based on shape-only, but requires a different calculation for processes that induce or modify the stresses in the film or structures on the front-side and back-side.

Figure 11C:
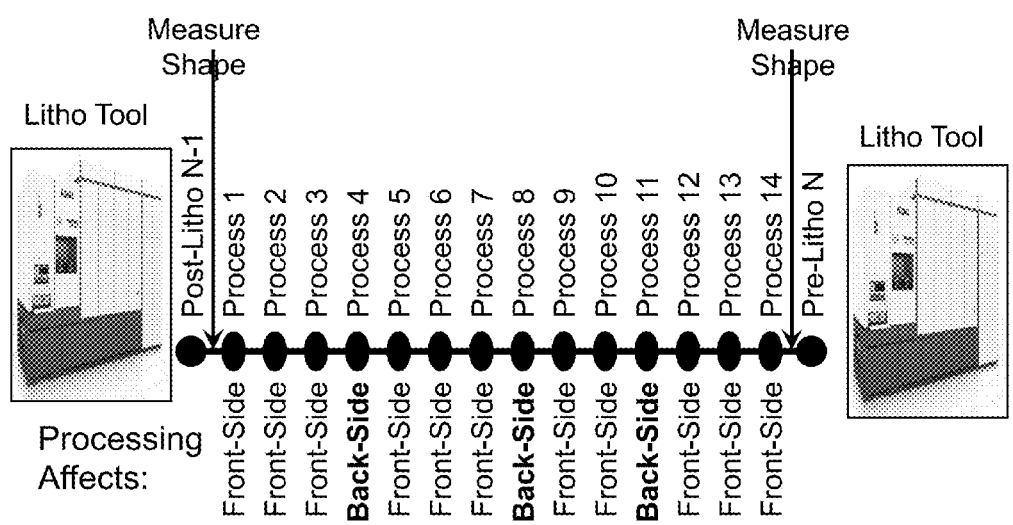

FIG. 11C is similar to FIGS. 11A and 11B and shows some back-side processes, though the shape measurement is still made prior to the front-side process 1 and after the front-side process 14 as in FIG. 11A. The measurement assumes that the individual processes distinctly affect a single side of the wafer 10 with some modifying front-side and others modifying back-side films/structures, and that shape measurements at multiple points in the process flow are NOT acceptable/practical.

A special case of this scenario is one where a process affects front-side and back-side simultaneously (i.e. shape measurements at multiple points may be acceptable, but not practical since the shape partitions cannot uniquely be associated with front-side or back-side stress non-uniformity).

The Calculation Requires Complementary Data.

Figure 11D:
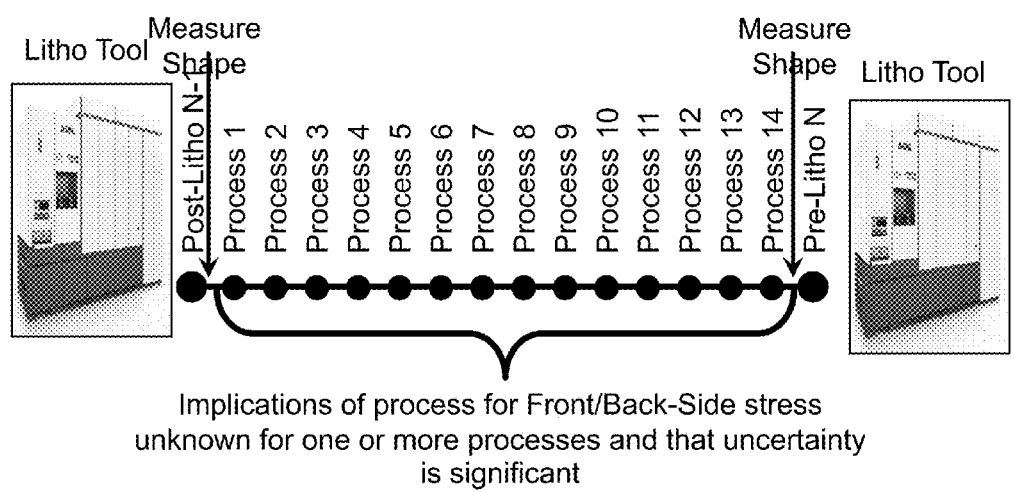

FIG. 11D is similar to FIGS. 11A through 11C and indicates that the implications of the processes on the front-side and back-side surface shape is unknown, i.e., there is a significant lack of information that prohibits the establishment of an unambiguous sampling plan. In other words, it is not clear whether particular processes affect the stress of front-side films/structures, back-side films, or both. A single shape measurement is made prior to the process segment of interest and following the completion of the process segment of interest. The calculation requires complementary data.

Calculation of Displacement Due to Front-Side/Back-Side Structures

Figure 12:
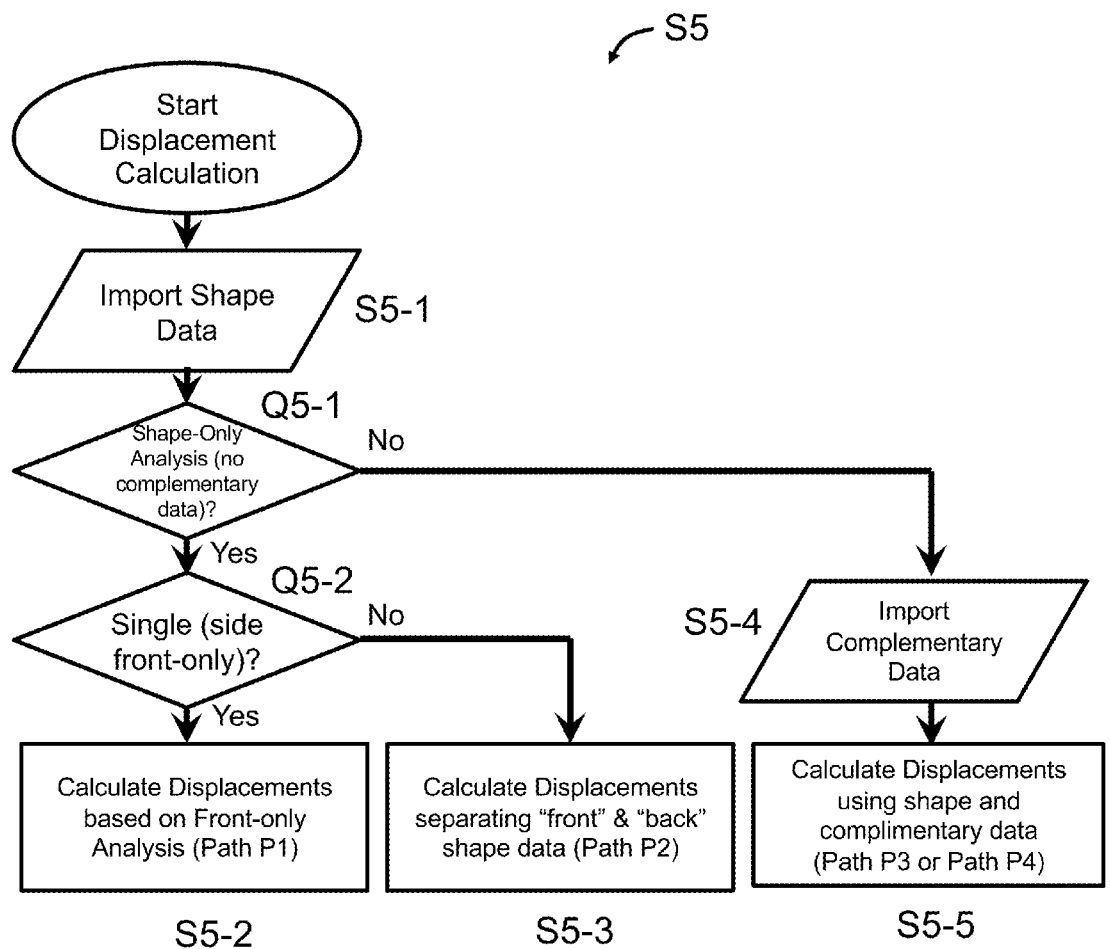
FIG. 12 is a flow diagram of the step S5 of the flow diagram of FIG. 8 showing three different options for performing the displacement calculation.

FIG. 12 is a flow diagram that shows the calculation of (x,y) displacement of the wafer 10 due to front-side and back-side structures and expands upon the step S5 of the flow diagram of FIG. 8.

The method of performing the displacement calculation includes a first step S5-1 of importing the measured shape data as measured using the CGS system 100. The method also includes the first query step Q5-1 that asks whether the analysis is "shape only," i.e., whether the analysis does not require complementary data. If the answer to the first query step Q5-1 is "yes," then the method proceeds to a second query step Q5-2 that asks whether the shape data is for a single side only. If the answer to the second query step Q5-2 is "yes," then the method proceeds to a second step S5-2 that calculates displacements based on the front-only analysis, i.e., the path P1 through the flow diagram of FIG. 9.

If the answer to the second query step Q5-2 is "no," then the method proceeds to a third step S5-3 that involves calculating the displacements using the front-side and back-side shape data.

If the answer to the first query step Q5-1 is "no," then the method proceeds to a fourth step S5-4 of importing complementary data, and then proceeds to a fifth step S5-5 of calculating displacements using shape and complementary data according to the paths P3 or P4.

Path P1 Calculation

The measurement of the surface shape and the surface displacements in the x-direction and the y-direction (see FIG. 1) according to the path P1 can be expressed as follows:

$$\Delta w(x, y) = w(x, y)_2 - w(x, y)_1 \qquad (B)$$

$$\frac{\partial}{\partial x}\Delta w(x, y) = \frac{\partial}{\partial x}\Delta w(x, y)\bigg|_{uniform\_stress} + \frac{\partial}{\partial x}\Delta w(x, y)\bigg|_{non\text{-}uniform\_stress} \qquad (C)$$

$$u(x, y) = Ch_s \frac{\partial}{\partial x}\Delta w(x, y) \qquad (D)$$

$$\bigg|_{non\text{-}uniform\_stress}; v(x, y) = Ch_s \frac{\partial}{\partial y}\Delta w(x, y)\bigg|_{non\text{-}uniform\_stress};$$

In the series of equations above, equation (B) determines the process-induced change in topography, Δw(x,y) between insertion points 1 and 2. Equation (C) indicates the computation of surface slope in the x-direction from the topography change computed from (B) and separation of that slope into its 'uniform-stress' and 'non-uniform stress' components. The non-uniform stress component of slope is then used to compute displacements as indicated by equations (D), which includes expressions for in-plane displacements in both the x-direction, u(x,y) and y-direction, v(x,y). The equations (B) through (D) are linear such that the exact order of specific computations is not important. For example, instead of computing change in topography first, the difference in shape between insertion points 1 and 2 could be computed in terms of the change in slope or the change in displacement instead. In a like manner, the separation of the 'uniform stress' and 'non-uniform stress' components of the deformation could be evaluated using topography, slope or displacement.

The 'Path 1' calculation applies to the case where all the displacements are due to stressed films on a single side of the substrate. Shape measurements may be made on the front-surface and/or back-surface of the substrate and therefore the coordinate system of the shape measurement should be consistent with the coordinate system associated with the above analysis.

Specifically, if the measurement is on the back, then the corresponding front-side slopes are inverse of the back-side slopes. In addition, the back-side Cartesian coordinate system may be flipped or rotated relative to the front-side. Either way, expressing a back-side shape measurement in terms of the coordinate system of the front-surface is a simple matter of geometric transformation.

Path P2 Calculation

The path P2 involves front-side and back-side calculations of the displacement, as follows. First the topography measurements associated with the front-side and back-side are grouped:

$$\Delta w(x,y)_{front} = (w(x,y)_2 - w(x,y)_1) + (w(x,y)_4 - w(x,y)_3) + (w(x,y)_6 - w(x,y)_5) + (w(x,y)_8 - w(x,y)_7) \qquad (E)$$

$$\Delta w(x,y)_{back} = (w(x,y)_3 - w(x,y)_2) + (w(x,y)_5 - w(x,y)_4) + (w(x,y)_7 - w(x,y)_6) \qquad (F)$$

The above equations are written in a manner consistent with the insertion points illustrated in FIG. 11B. Once the cumulative front-side topography and back-side topography changes are computed, the front-side and back-side displacements are computed in a manner analogous to equations (B) and (C) above. As in the 'Path 1' case, the order of the computations is not important for a linear process.

Specifically, all the 'front' or 'back' shape measurements can be summed as topography, slope or displacement with the same result; equations (E) and (F) are provided as illustrative of the summation process.

These calculations "group" the front-side and back-side shape measurements and analyze them accordingly, including incorporating a factor of −1 for the back-side slopes. The total in-plane displacements are then simply the sum of the displacements due to front-side and back-side films:

$$u(x,y)|_{total} = u(x,y)|_{front} + u(x,y)|_{back}; v(x,y)|_{total} = v(x,y)|_{front} + v(x,y)|_{back} \qquad (G)$$

Path P3 and P4 Calculations

The path P3 and P4 calculations involve carrying of the steps S1-6 and S1-7 of the flow diagram of FIG. 9 relating to obtaining complementary data to isolate the front-side and back-side displacements.

In an example, the complementary data is obtained using lithography alignment marks 16 formed on the front-side and back-side wafer surfaces. Prior to exposure in a lithography tool, the alignment mark positions are measured to locate the wafer 10. The relative positions of these alignment marks can be related to the in-plane displacement. Comparing the alignment mark measurement with the shape-based in-plane displacement measurement can be used to determine the relative contribution to displacement from the front-side and back-side films using equations (A)-(G). Similar formulations would be used for other complementary data sources.

Note that 'slope' is local tilt or first derivative of topography and the substrate thickness is $h_s$; these equations apply to both x-direction and y-direction alignment, displacement and slope as based on a front-side shape measurement.

The following equations are used to calculate the displacement and slopes. First, recognize that the displacement implied by the alignment mark 16 is simply the sum of the displacement due to front-side and back-side films:

$$u(x,y)|_{alignment} = u(x,y)|_{total} = u(x,y)|_{front} + u(x,y)|_{back} \qquad (H)$$

Note that equation (H) assumes that any systematic component of the alignment measurement that is not associated with wafer deformation (e.g. variability in wafer-placement) is negligible, compensated for through other means and/or subtracted from the displacement measurement. Second, the total measured slope is simply the sum of the front-side and back-side slopes:

$$\frac{\partial}{\partial x}\Delta w(x, y)\bigg|_{measured} = \frac{\partial}{\partial x}\Delta w(x, y)\bigg|_{front} + \frac{\partial}{\partial x}\Delta w(x, y)\bigg|_{back} \qquad (I)$$

Equations (H), (I) and (D) can be combined to eliminate the slopes due to films on the back surface as:

$$u(x, y)\bigg|_{alignment} = C\left(2\frac{\partial}{\partial x}\Delta w(x, y)\bigg|_{front} - \frac{\partial}{\partial x}\Delta w(x, y)\bigg|_{measured}\right) \qquad (J)$$

Which can be re-arranged to solve for the slope due to front-surface films as a function of the available data (i.e. alignment and measured total slope):

$$\frac{\partial}{\partial x}\Delta w(x, y)\bigg|_{front} = \frac{1}{2}\left[\frac{1}{C}u(x, y)\bigg|_{alignment} + \frac{\partial}{\partial x}\Delta w(x, y)\bigg|_{measured}\right] \qquad (K)$$

The solution for equation (K) for slopes due to front-side films can then be used to compute slopes due to back-side films (i.e. substitute in equation (I)). Equations similar to (J) and (K) could also be developed to solve for slopes due to back-side films first, and then subsequently for the front. Again, the exact order of computation (front-then back- or back-then front) is not relevant. The result of these calculations provides the information on the relative contribution of the front-surface films and back-surface films to the total measured shape change.

Combining Wafer Shape Measurements with Alignment Mark Measurements

An aspect of the methods disclosed herein includes making measurements of alignment marks 16 and combining these measurements with wafer shape measurements. Alignment mark measurements typically have low within-wafer density (10's of measurements per wafer) and full-wafer shape measurements can be very high density (100,000's to millions of points per wafer).

The combination of full-wafer shape measurements with alignment mark measurements can therefore be used in different ways:

(1) As an input to the alignment mark measurement: Target locations used for alignment can be selected based on regions of high slope indicated by the full-wafer shape measurement;

(2) Improved accuracy of the shape-based displacement measurements when contributions from both front-side and back-side films are significant: If the front-side/back-side ratio determined using the above equations is reasonably constant or can be extrapolated with confidence to all points of the full-wafer shape measurement, the full-wafer displacement can be determined in regions of the wafer 10 where the density or accuracy of the alignment mark measurements may not be sufficient to achieve the desired overlay.

(3) The method of comparing alignment marks and full-wafer in-plane displacement can also be completed periodically with relatively high density (e.g. using 100's or 1000's of alignment marks) for a given lithographic layer/process to establish a nominal baseline or reference for a series of process steps. Such high density may not be practical for high volume manufacturing (HVM), but can provide a periodic "calibration." In other words, the high-density alignment mark measurement establishes the nominal front-side/back-side displacement ratio and subsequent low-density alignment mark measurements during normal HVM can be checked against the nominal reference. Depending on differences between the 'reference' and the HVM measurements, different actions can be taken.

For example: (i) Reference and HVM measurements are within a specific tolerance—no action, apply reference data to full-wafer displacement data; (ii) Reference and HVM measurements differ by more than a lower control limit and below an upper control limit—modify front-side/back-side ratio applied to full-wafer displacement data and/or acquire data at additional alignment mark positions (iii) Reference and HVM measurements differ by more than an upper control limit—stop processing.

Process Control

An aspect of the disclosure includes using the surface shape information as determined using the above methods to control the semiconductor process to improve the process, e.g., to improve yield.

Accepted methodologies exist for the use of alignment mark data in the compensation of the lithographic system for the exposure of a specific layer. The current approach allows for the incorporation of additional data indicating the local in-plane displacements at all points on the wafer 10. Again, the compensation of a lithographic system based on the alignment mark measurement typically involves 10's of alignment mark measurements. The use of in-plane displacement data increases the available data to potentially millions of data points, leading to improved alignment in regions where the alignment mark density is generally low, such as the wafer edge. The wafer edge is of particular importance since advanced devices generally have lower manufacturing yields at the wafer edge.

In a similar manner, if the complementary data set involved post-exposure overlay data instead of or in addition to alignment data, the higher density displacement data could be fed-backward to improve alignment compensation for subsequently exposed wafers. Again, the use of overlay data in a feed-backward implementation is well-established in current leading edge device manufacturing; the displacement data provides an alternate and significantly higher density data source to improve the accuracy of corrections across the entire wafer 10 and not just those locations with measured overlay targets or alignment marks.

It will be apparent to those skilled in the art that various modifications and variations can be made to the present disclosure without departing from the spirit and scope of the disclosure. It is thus intended that the present disclosure cover the modifications and variations of this disclosure provided they fall within the scope of the appended claims and their equivalents.

What is claimed is:

1. A method of determining an in-plane displacement on a front-side of a first wafer having a back-side spaced from the front-side and subject to one or more semiconductor manufacturing process steps, comprising:
   a) prior to performing the one or more semiconductor manufacturing process steps, performing a first measurement of a first shape of at least one of the front-side and back-side surfaces of the first wafer according to a wafer-shape sampling plan;
   b) performing at least one of the one or more semiconductor manufacturing process steps on at least one of the front-side and the back-side of the first wafer;
   c) performing a second measurement of a second shape of at least one of the front-side and back-side surfaces of the first wafer after carrying out step b) using the same wafer-shape sampling plan of step a);
   d) determining a process-induced change in the first shape of the first wafer by comparing the first and second measurements; and
   e) determining the in-plane displacement as a function of the process-induced change in the first shape and as a function of a displacement calculation that varies based on which one or more of the front-side and the back-side is stressed by the one or more semiconductor manufacturing process steps so as to cause the process-induced change in the first shape.

2. The method according to claim 1, further comprising: processing a second wafer using the one or more semiconductor manufacturing processing steps; and altering at least one of the one or more semiconductor manufacturing process steps based on the determined process-induced change in a shape of the second wafer when processing the second wafer.

3. The method according to claim 1, further comprising: adjusting at least one of the one or more semiconductor manufacturing process steps that have not yet been applied to the first wafer based on the determined process-induced change in the first shape of the first wafer; and processing the first wafer using the adjusted one or more semiconductor manufacturing processes steps.

4. The method according to claim 1, further comprising:

making surface displacement measurements using alignment marks on at least one of the front-side and back-side of the first wafer, and using the surface displacement measurements in step d) of determining the process-induced change in the first shape of the first wafer.

5. The method according to claim 1, wherein the first wafer includes front-side alignment marks on the front-side of the first wafer and back-side alignment marks on the back-side of the first wafer, and further comprising:

making first measurements of a surface displacement on the front-side of the first wafer using the front-side alignment marks after performing a front-side process step;

making second measurements of a surface displacement on the back-side of the first wafer using the back-side alignment marks after performing a back-side process step; and using the first and second measurements of the surface displacement to identify respective contributions of the front-side and back-side process steps to the process-induced change in the first shape of the first wafer of step d).

6. The method according to claim 1, wherein the first wafer includes front-side alignment marks on the front-side of the first wafer and back-side alignment marks on the back-side of the first wafer, and further comprising:

making an overlay measurement using the front-side and back-side alignment marks to identify respective contributions of front-side and back-side process steps to the process-induced change in the first shape of the first wafer of step d).

7. The method according to claim 1, further comprising:

making a first stress measurement on the front-side of the first wafer after performing a front-side process step;

making a second stress measurement on the back-side of the first wafer after performing a back-side process step; and using the first and second stress measurements to identify respective contributions of the front-side and back-side process steps to the process-induced change in first shape of the first wafer of step d).

8. The method according to claim 1, wherein the first and second measurements each include front-side and back-side measurements.

9. The method according to claim 1, wherein the first and second measurements each include only front-side measurements.

10. The method according to claim 1, wherein the first and second measurements each include only back-side measurements.

11. The method according to claim 1, wherein the at least one of the one or more semiconductor manufacturing process steps carried out in step b) includes multiple ones of the semiconductor manufacturing process steps carried out on a single lithography tool.

12. The method according to claim 1, wherein the at least one of the one or more semiconductor manufacturing process steps carried out in step b) includes multiple ones of the semiconductor manufacturing process steps carried out on different lithography tools.

13. The method according to claim 1, wherein step b) includes forming a semiconductor structure on at least one of the front-side and back-side of the first wafer.

14. The method according to claim 1, wherein step b) includes processing an existing semiconductor structure on at least one of the front-side and back-side of the first wafer.

15. The method according to claim 1, wherein the first and second measurements each includes at least $10^6$ data points.

16. The method according to claim 1, wherein the first and second measurements each includes between $1 \times 10^5$ data points and $5 \times 10^6$ data points.

17. The method according to claim 1, further comprising developing the wafer-shape sampling plan based at least in part on whether the one or more semiconductor manufacturing process steps are all front-side process steps, are all back-side process steps, or are a mix of front-side process steps and back-side process steps.

18. The method according to claim 1, further comprising developing the wafer-shape sampling plan based at least in part on whether or not multiple insertion points are required to isolate contribution of one or more front-side process steps to the process-induced change in the first shape from contribution of one or more back-side process steps to the process-induced change in the first shape.

19. The method according to claim 18, wherein, when multiple insertion points are not required, the developing of the wafer-shape sampling plan includes performing the first measurement and the second measurement once each.

20. The method according to claim 18, wherein:

when multiple insertion points are required, the developing of the wafer-shape sampling plan includes performing the first measurement and the second measurement multiple times in alternating series to obtain multiple sets of measurements; and step e) further includes determining the in-plane displacement further as a function of the multiple sets of measurements.

21. The method according to claim 18, wherein, when multiple insertion points are required, the method developing of the wafer-shape sampling plan further includes determining whether or not multiple insertion points are possible or practical.

22. The method according to claim 21, wherein multiple insertion points are neither possible nor practical, and step e) further includes determining the in-plane displacement further as a function of complementary data.

23. The method according to claim 1, wherein each of the first and second measurements is a coherent gradient sensing interferometric measurement.

* * * * *